United States Patent
Diebel et al.

(10) Patent No.: US 9,226,559 B1
(45) Date of Patent: Jan. 5, 2016

(54) CASE FOR ELECTRONIC TABLET

(71) Applicant: Incase Designs Corp., Chino, CA (US)

(72) Inventors: Markus Diebel, San Francisco, CA (US); Scott Davis, Fairfax, CA (US); Luke Arthur Pushee, San Francisco, CA (US); Bruce Owyoung, San Francisco, CA (US); Timothy Ahn, Dublin, CA (US)

(73) Assignee: Incase Designs Corp., Chino, CA (US)

( * ) Notice: Subject to any disclaimer, the term of this patent is extended or adjusted under 35 U.S.C. 154(b) by 0 days.

(21) Appl. No.: 13/841,151

(22) Filed: Mar. 15, 2013

Related U.S. Application Data

(63) Continuation-in-part of application No. 29/427,146, filed on Jul. 13, 2012, now abandoned.

(60) Provisional application No. 61/648,364, filed on May 17, 2012.

(51) Int. Cl.
| | |
|---|---|
| *B65D 85/00* | (2006.01) |
| *A45C 11/00* | (2006.01) |
| *B65D 25/24* | (2006.01) |
| *G06F 1/16* | (2006.01) |
| *A45C 13/02* | (2006.01) |
| *B65D 85/64* | (2006.01) |

(52) U.S. Cl.
CPC ............... *A45C 11/00* (2013.01); *B65D 25/24* (2013.01); *A45C 2013/025* (2013.01); *B65D 85/64* (2013.01); *G06F 1/1628* (2013.01)

(58) Field of Classification Search
CPC  G06F 1/1628; A45C 2013/025; A45C 11/00; B65D 85/64; B65D 25/24
USPC ........ 206/305, 320, 45.21–45.25, 45.27, 762; 361/679.55, 679.56; 248/450, 457, 248/459, 460, 463; 455/575.1, 575.8
See application file for complete search history.

(56) References Cited

U.S. PATENT DOCUMENTS

| | | | | |
|---|---|---|---|---|
| 8,757,375 | B2* | 6/2014 | Huang | 206/320 |
| 2003/0024970 | A1* | 2/2003 | Lonergan | 206/45.24 |
| 2011/0290687 | A1* | 12/2011 | Han | 206/320 |
| 2012/0043234 | A1* | 2/2012 | Westrup | 206/320 |
| 2012/0181195 | A1* | 7/2012 | Lu et al. | 206/320 |
| 2012/0211613 | A1* | 8/2012 | Yang et al. | 248/174 |
| 2012/0305413 | A1* | 12/2012 | Chung | 206/45.23 |
| 2013/0001107 | A1* | 1/2013 | Armstrong | 206/320 |
| 2013/0020214 | A1* | 1/2013 | Chiou | 206/320 |
| 2013/0020216 | A1* | 1/2013 | Chiou | 206/320 |
| 2013/0043148 | A1* | 2/2013 | Chen et al. | 206/45.23 |

OTHER PUBLICATIONS

Pong iPad 2 Case Product Reference, Mar. 7, 2012, 14 pages.
Incase Origami Sleeve Product Reference, Nov. 3, 2010, 9 pages.
iLuv OrigamiFolio Product Reference, Mar. 7, 2012, 13 pages.
Acme Made Orikata Product Reference, Aug. 15, 2011, 20 pages.

* cited by examiner

*Primary Examiner* — Luan K Bui
(74) *Attorney, Agent, or Firm* — Aka Chan LLP

(57) ABSTRACT

A front cover for a portable electronic device, such as a tablet computer, includes a plurality of panel sections and a plurality of hinges formed in the front cover. Each panel section is separated from another by a hinge. This front cover can be folded along the hinges to act as stand for the portable electronic device. This stand can support the device in various working and viewing angles, for both portrait and landscape orientations.

14 Claims, 25 Drawing Sheets

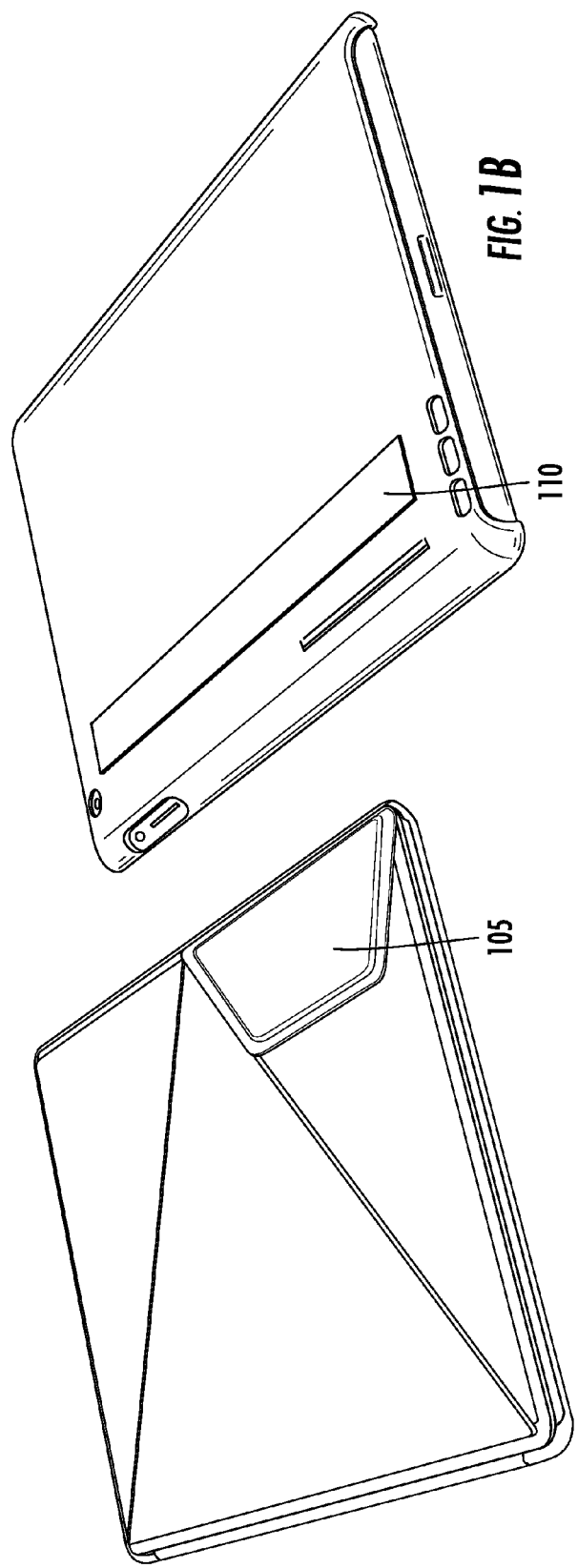

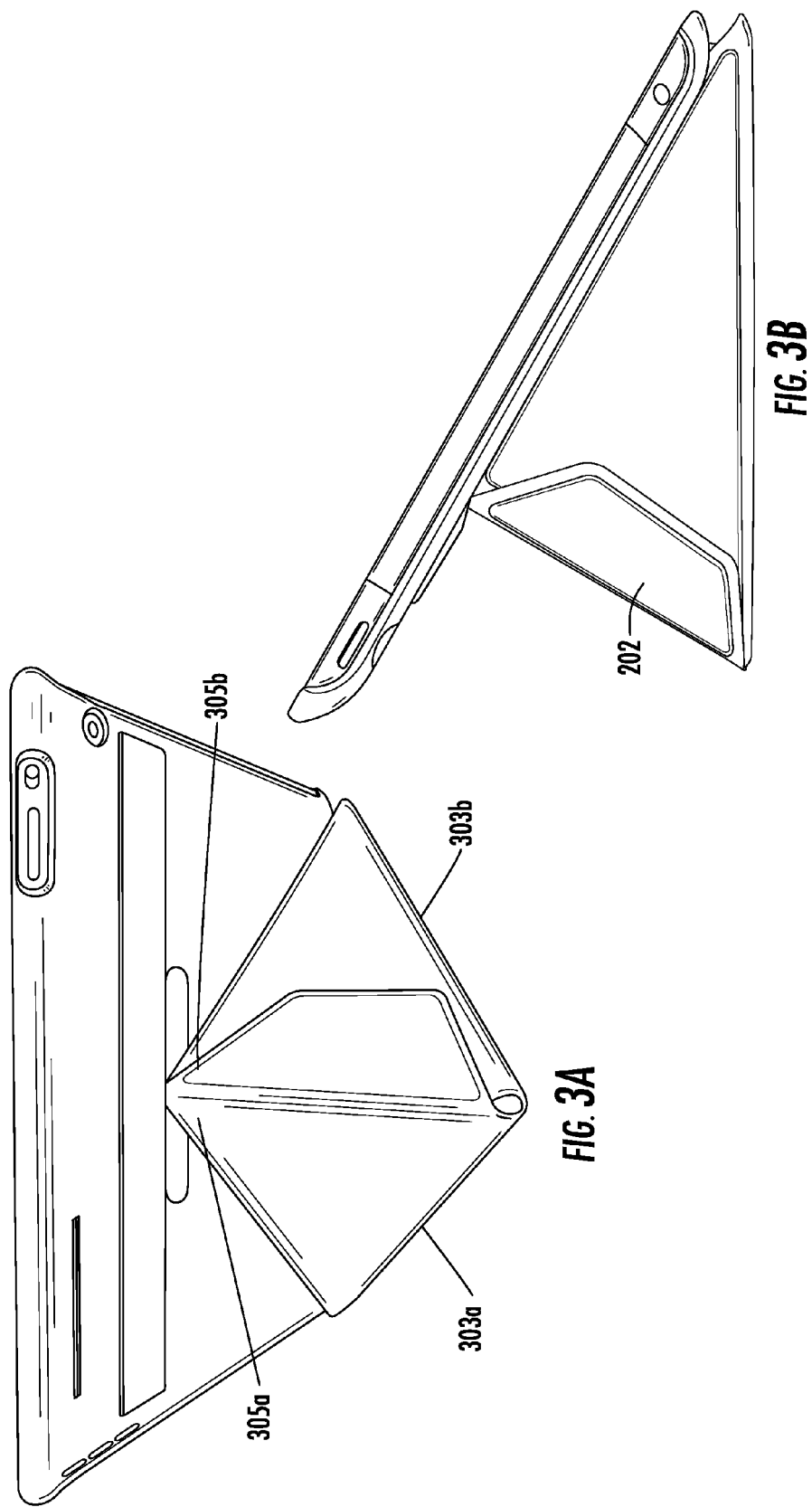

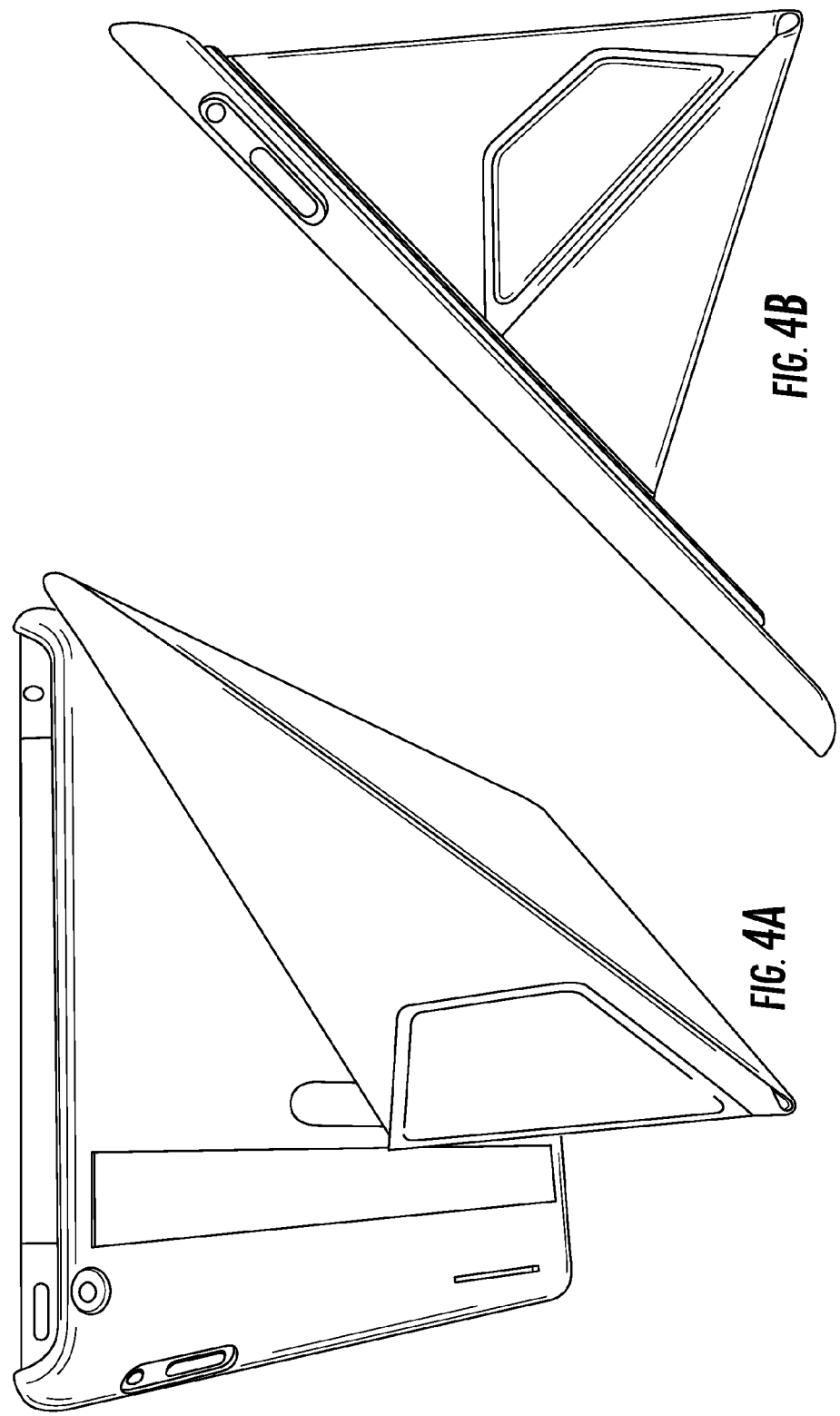

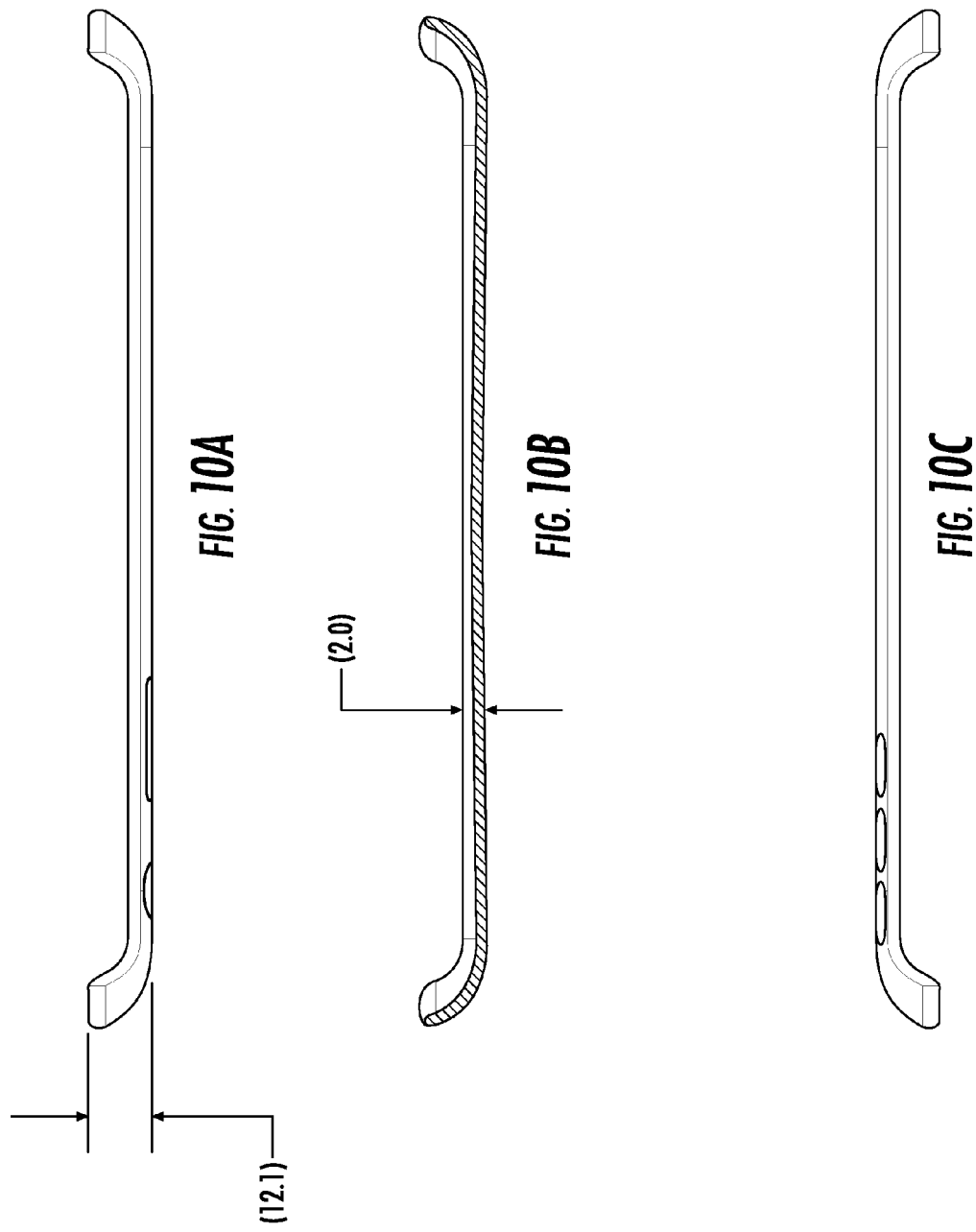

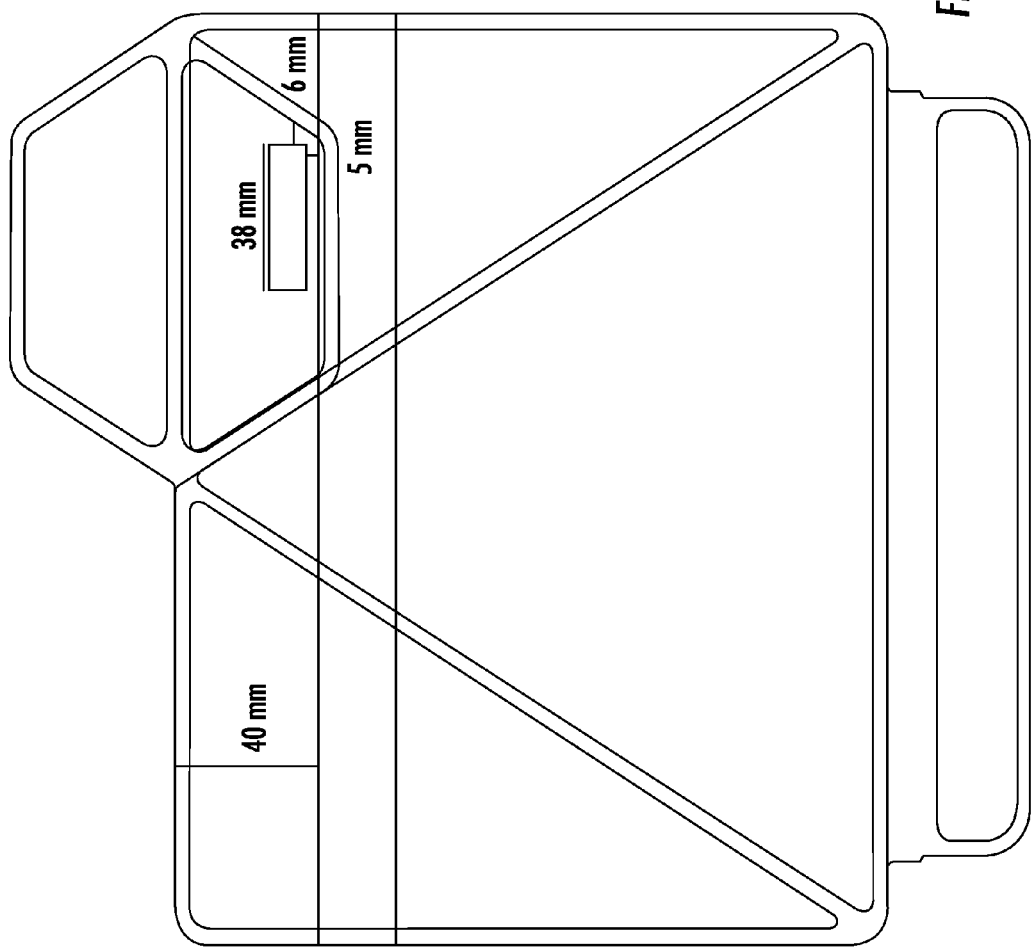

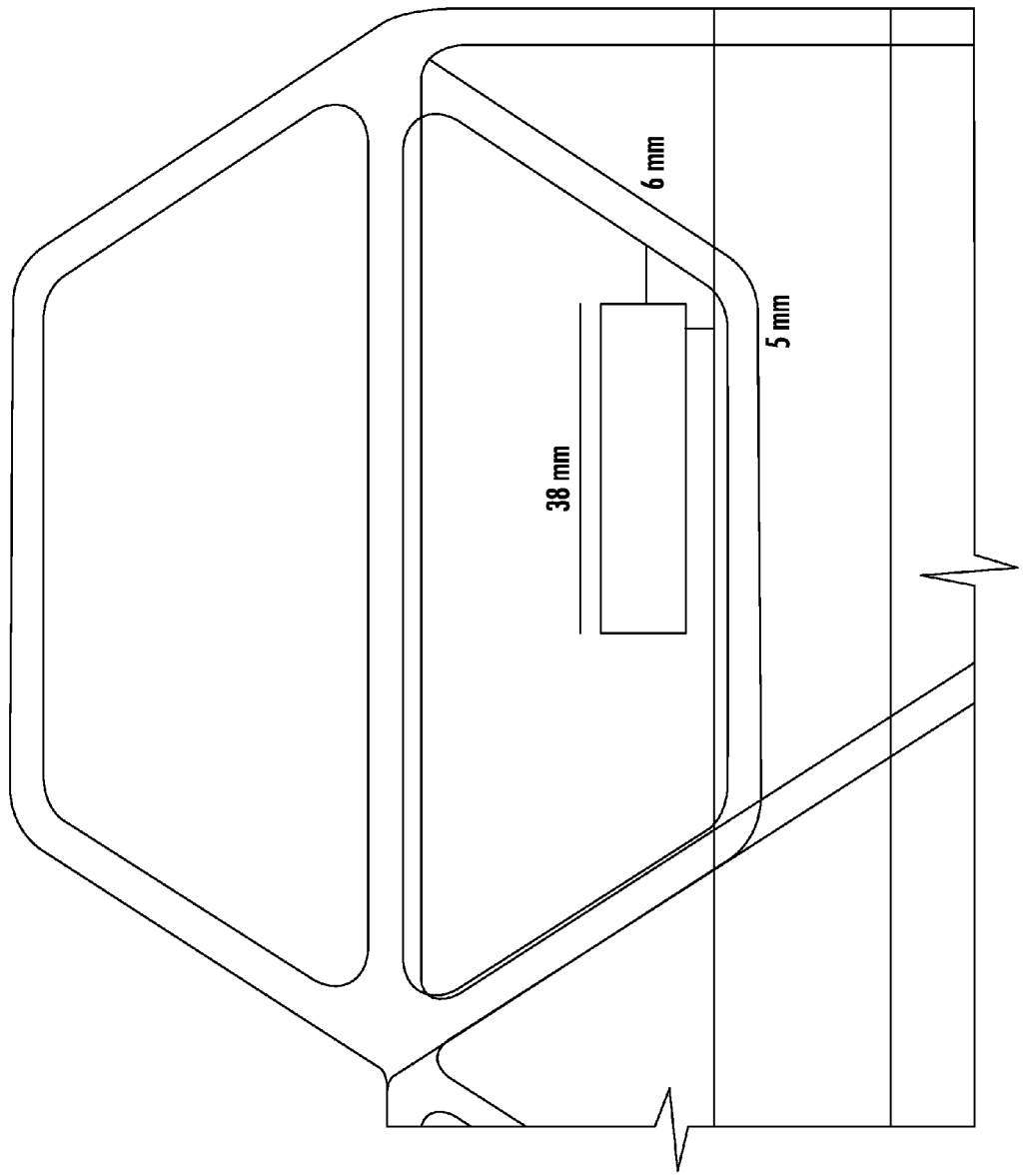

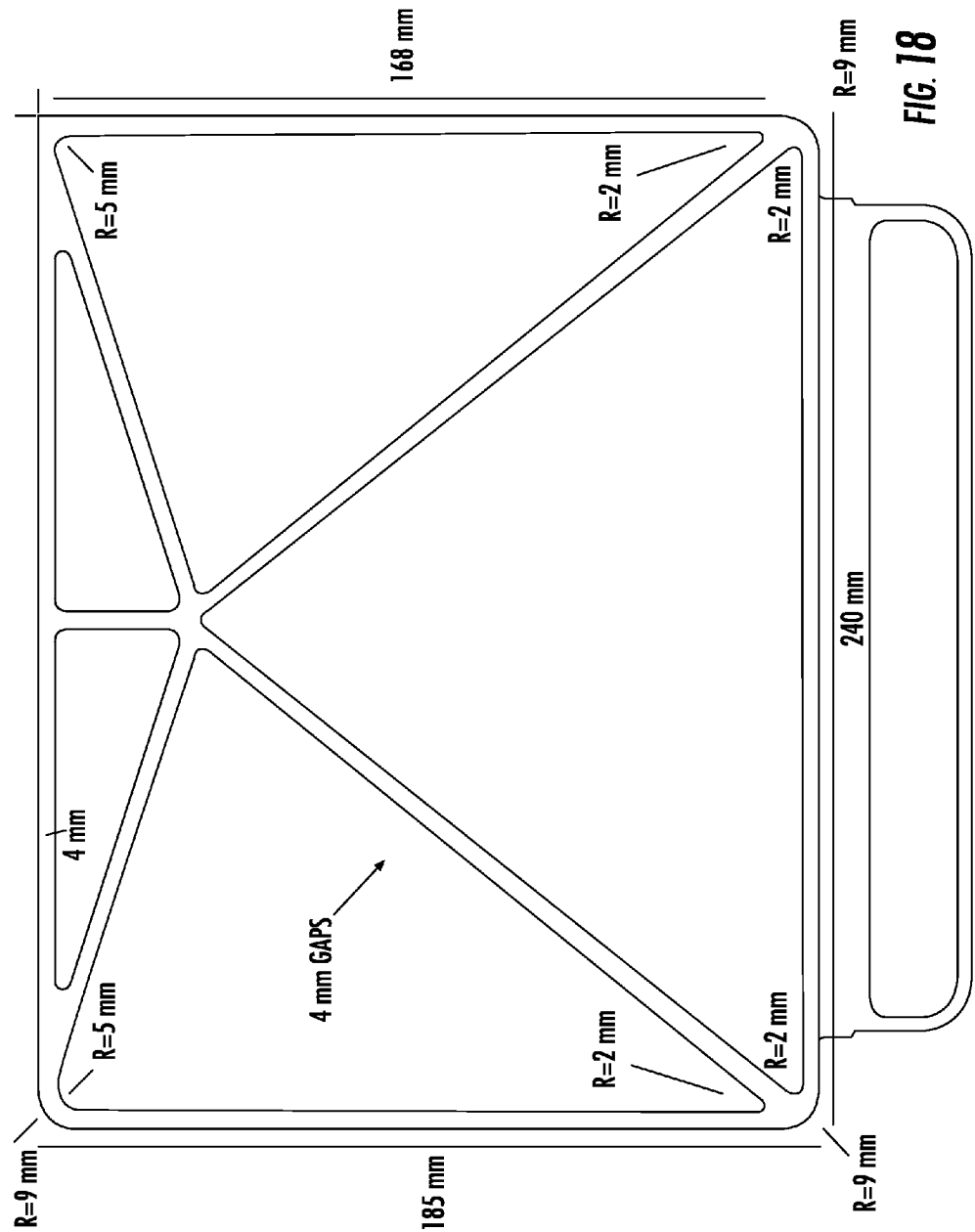

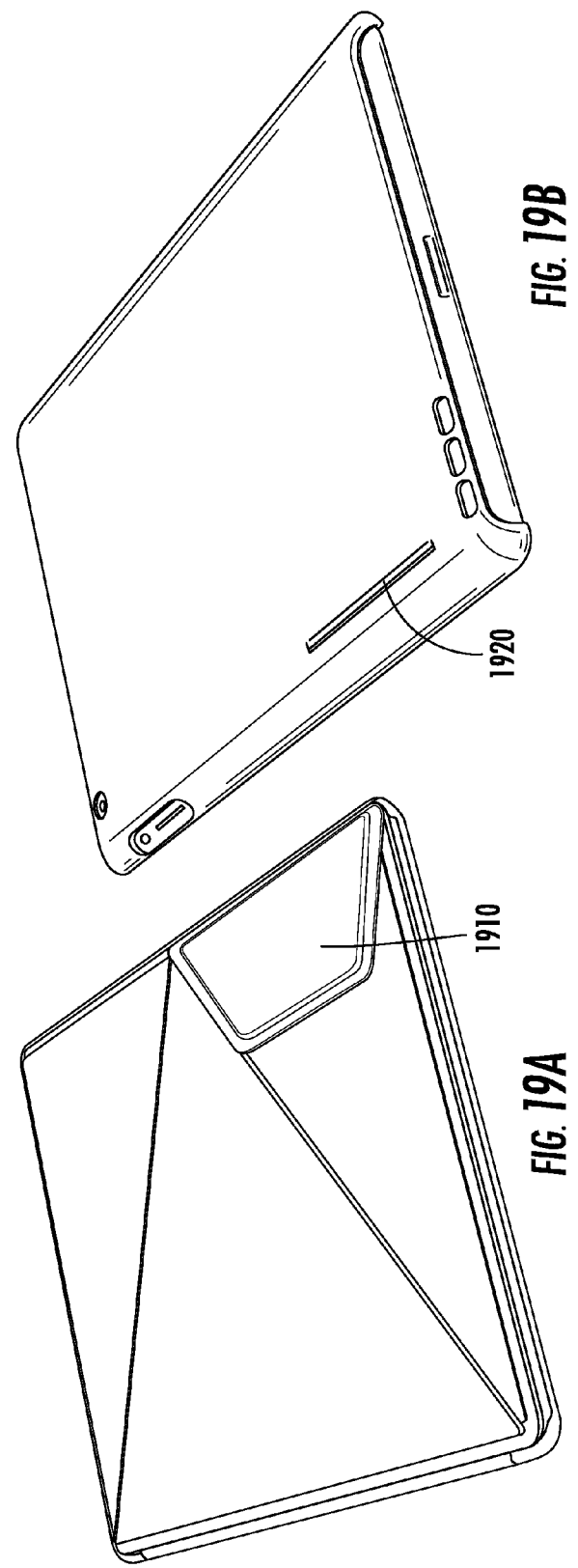

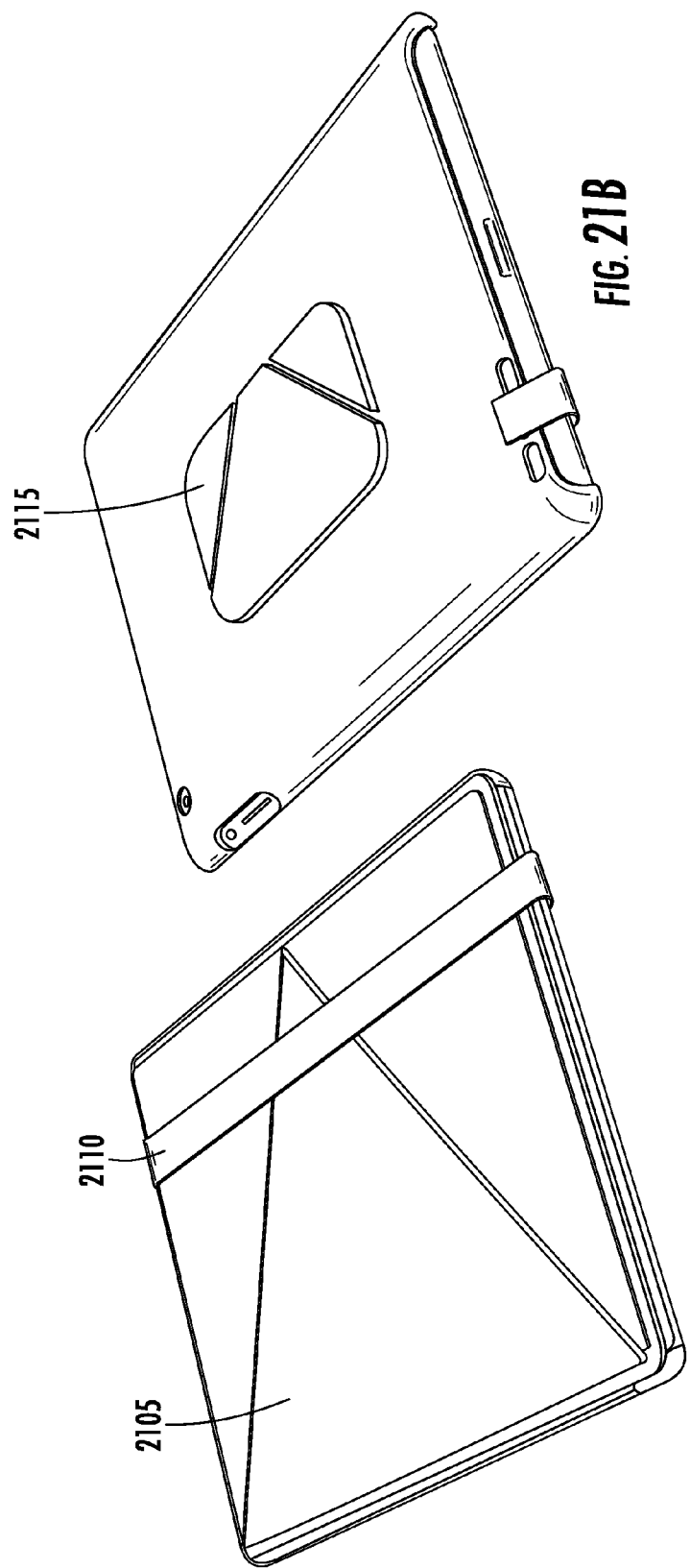

CASE FOR ELECTRONIC TABLET

CROSS-REFERENCE TO RELATED APPLICATIONS

This patent application claims the benefit of U.S. patent application 61/648,364, filed May 17, 2012, and is a continuation in part of U.S. patent application Ser. No. 29/427,146, filed Jul. 13, 2012 now abandoned, which are incorporated by reference along with all other references cited in this application.

BACKGROUND OF THE INVENTION

This invention relates to accessories for electronic devices and more specifically to cases for portable electronic devices and electronic tablets.

With each new generation, portable electronic devices provide greater functionality and have more capabilities. These portable electronic devices allow people to play and record music, send and receive e-mail, send text messages, browse Web pages, make phone calls, play and record video, take and view pictures, edit documents, and much more. These devices continue to revolutionize the way people interact, learn, connect with other people, conduct business, and find things. They help people manage their daily lives and can be a source of entertainment. These devices can be used to store valuable information including personal information (e.g., phone numbers, financial information, private photos or videos, and favorite music tracks).

Typically these devices are intended to be carried or moved about. As such, these devices are more vulnerable to damage as compared to non-portable devices. These devices are more likely to be accidentally dropped, hit, or scratched. Some types of damage may be cosmetic (e.g., scratch). However, other types of damage may ruin or limit the functionality of the device. Often these devices contain sensitive and fragile components (e.g., screen, camera lens, flash, processors, accelerometers, and sensors). Accidentally dropping the device could render various features unusable.

Protective cases are used to protect these devices from possible damage. It is desirable that these cases allow users to use the functionality of their devices, while devices remain in their cases. Cases can also be used to enhance the functionality and capabilities of the device.

Therefore, there is a need for cases for portable electronic devices that will protect the devices, while at the same time enhance the functionality and usability of the devices.

BRIEF SUMMARY OF THE INVENTION

A case incorporates a built-in stand for the device which the case houses. The built-in stand allows using the case as a stand without needing to carry a separate standalone stand device. By incorporating the stand as part of the case, the case has additional functionality and usability. Since the stand is built-in or integrated, the stand will be available wherever the case is and is harder to lose than having a separate stand.

The built-in stand permits the user to interface with the electronic device housed in the case at different viewing and working angles. One feature of the present invention is the ability to stand in a portrait orientation at a working angle. This permits the user to interact with certain websites and applications that may only be available in a portrait orientation.

In a specific implementation, a case for a portable electronic device has a front and back cover, with a spine connecting the front and back covers, which acts as a hinge that allows the front and back covers to open and close.

The front cover includes three triangular sections, each separated from another by a fold line or hinge. The front cover has first and second fold lines. The front cover includes a second flap which is attached to an edge of the front cover which is opposite the first flap. In implementation, the second flap has a trapezoidal shape, but in other implementations, the second flap may have a different shape (e.g., quadrilateral, parallelogram, rectangle, square, triangle, or other). The second flap is joined to the front cover using a fold line or hinge. When the second flap is folded to touch the front cover, the second flap touches a triangle.

When the front cover is opened, folded under the back cover to lie flat, and the back cover is angled in a first position (first working angle, about 7 to 12 degrees) a side view will be triangular in shape. The back cover is secured in this angled position by rotating the second flap away from the front corner, to insert into working angle stop (e.g., a groove or slit) which is cut into the exterior face of the back cover.

In a second working position, the case is opened and sits in a landscape orientation. The front cover is folded so that two adjacent corners of the front cover can meet together. In this stand position, the two adjacent corners meet (or touch) and also touch the back of the back cover (or tablet device when there is no back cover). Furthermore, the second flap of the front cover can be used to hold this stand shape and corner together. In an implementation, the second working angle is from about 30 to 38 degrees. The second working angle is at a greater sloped angle than the first working angle.

In a third working position, wherein the case sits in a portrait orientation. The case is rotated 90 degrees (or 270 degrees) with respect to the landscape orientation as described by the second working angle position. The display will be oriented so it is taller than it is wide. The front cover is folded similarly as described for the second working angle position, but the stand and tablet have been rotated 90 degrees. In an implementation, the third working angle is from about 40 to 48 degrees.

The front cover can be folded in a viewing angle position. The front cover is folded similarly as described for the second working angle position, but the stand and tablet have been rotated 180 degrees. Also, the adjacent corners meet or touch, but these corners do not touch the back of the back cover or tablet. Rather, these corners may touch a surface on which the stand is set on. In an implementation, the first viewing angle is from about 43 to 50 degrees.

The case may also include an elastic band or band that can hold the cover closed onto the front of the electronic device. This prevents the screen of the electronic device from damage. The elastic band can be used as a hand band when the cover is folded back.

The front cover can be folded into a fourth working angle for the device, in a landscape orientation. In this stand position, the two adjacent corners are rotated toward each other and touch the back of the back cover (or tablet device) at two different points. An elastic band attached to the back cover can be used to hold the stand in this stand position. In an implementation, the fourth working angle is from about 20 to 30.

The front cover can be folded into a stand for a second viewing angle for the device. The device is in the landscape orientation. The front cover is folded similarly as described for the fourth working angle position, but the stand and tablet have been rotated 180 degrees. In an implementation, the second viewing angle is from about 70 to 80 degrees.

The case may be constructed with hardened material, for a hard shell construction around the electronic device. The electronic device may also be fitted to the case by "snapping in" the four corners of the device in specifically designed slots on the corners of the bottom cover of the device to hold the electronic device. The case may also include a rubberized exterior for aesthetic and durability purposes. The sides and covers of the device may also include openings that allow direct access to ports and other features of the electronic device enclosed within.

In an implementation, a case includes: a back cover, including two or more retaining clips that hold an electronic device against an inside of the back cover; a front cover, connected to the back cover, where a first fold line is between the front cover and back cover that allows the front cover to swing between covering a front of the electronic device and an outside of the back cover. The front cover includes three triangles having two fold lines between them. A first and second of the triangles of the front cover have the same area, and touch at a first vertex at an edge of the front cover that is opposite of the first fold line. A third triangle has twice the area of the first triangle.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 1A-1D show various views of an implementation of a case for a portable electronic device (e.g., tablet computer).

FIGS. 3A-3B show views of the case folded into a stand for a second working angle, landscape orientation.

FIGS. 4A-4B show views of the case folded into a stand for a third working angle, portrait orientation.

FIGS. 10A-10C show side views and a cross-sectional view of the back cover from a second direction, perpendicular to the first direction.

FIG. 16 shows a front cover and a positioning an elastic band and a logo.

FIG. 17 shows a more detail view of a section of the front cover with flap, elastic band and logo.

FIG. 18 shows a schematic for another implementation of the front cover.

FIGS. 19A-19D show views of another implementation of a case for a portable electronic device.

FIGS. 21A-21B show views of another implementation of a case for a portable electronic device.

DETAILED DESCRIPTION OF THE INVENTION

Figure 1D:
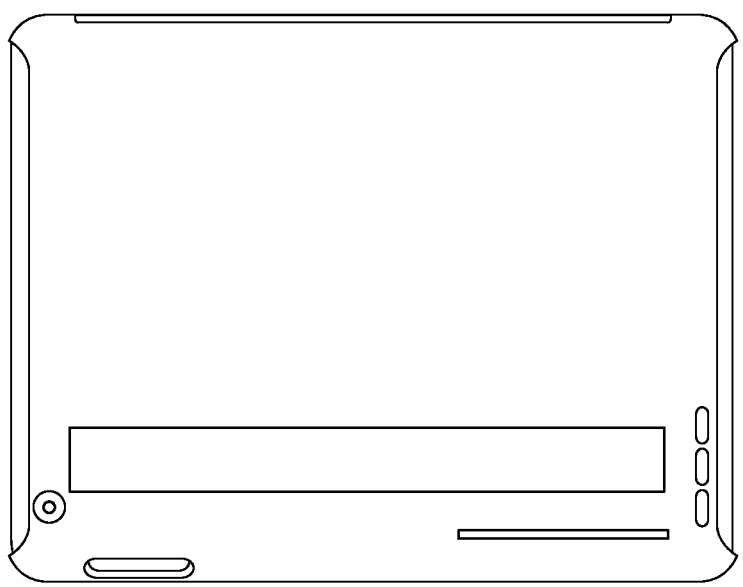

FIGS. 1A-1D show front and back views of a closed case for a portable electronic device. Specific implementations of cases incorporating aspects of the invention may be manufactured by Incase Designs Corp. and known as the Origami Jacket, Magnetic Origami Jacket, Origami Magazine Jacket, or Origami Case, all of which are trademarks of Incase. This patent application incorporates by reference U.S. patent application Ser. No. 12/892,736, filed Aug. 28, 2010, issued as U.S. Pat. No. 8,328,008 on Dec. 11, 2012, and 61/372,450, filed Aug. 10, 2010.

FIGS. 1A-1D show perspective front, perspective back, front, and back views of the case. In an implementation, the case is for a tablet computer, tablet PC, or other tablet-type electronic device. Some examples of electronic tablets include Apple iPad, Dell Streak, HP TouchPad, Toshiba Portege, Fujitsu Lifebook, Lenovo IdeaPad, Toshiba Libretto, Amazon Kindle, Sony Reader, Barnes & Noble Nook, Microsoft Courier, and others. Aspects of the invention are also applicable to other types of devices including smartphones (such as the Apple iPhone and Google Android phones), personal digital assistants (PDAs), handheld computers, and notebook computers. Any trademarks listed in this patent application are the property of their respective owners.

Portable electronic device are valuable because their functionality, the information they contain, and time and expense to replace. A case is typically much easier and less expensive to replace than the device which it houses and protects.

A case protects the portable electronic device from scratches, dings, dents, and other damage. The case also provides shock absorption. The case will absorb impacts, preventing shock to the components of the device which are often delicate. The case can also improve the grip to the device and case combination. The case may include a texture pattern, be made from a tacky material, or have a tacky coating, or include a wrist strap. The case may also be waterproof or water resistant to protect the device from rain, snow, and surf.

A case is typically an important accessory for the device that it protects. For example, a person might accidentally drop a portable electronic device that is in the case on the floor when running to catch a flight for a business trip at the airport. The case can cushion the drop, thus preventing major damage to the portable electronic device. The portable electronic device will remain intact and unbroken, saved by the case. The person can pick up the portable electronic device, continue on the flight, and use the portable electronic device on the business trip.

If the portable electronic device had not been protected by a case, the portable electronic device might have become broken. The screen may become cracked or there might have been other damage rendering the device inoperable. The person typically would not have been able to replace the portable electronic device soon enough, especially if there was important information saved on the device (e.g., sales presentation slides) that are needed for the business trip.

In addition to protecting a device, a case can include further functionality to enhance the utilization of the portable electronic device. An additional feature is to incorporate a built-in stand for the case. This stand can serve to prop up the portable electronic device at various viewing angles for a user. By incorporating the stand with the case, a person can more easily travel with the stand than with a separate standalone stand. Additionally, a built-in stand cannot be accidentally left behind like a separate stand.

When using the portable electronic device, a person would at different times need to hold or set the electronic device onto a surface to work on. When the electronic device is set on a surface, it is difficult to view the electronic device if it is laying flush on top of a table. Also, for electronic devices that allow the person to input into the electronic device, it is difficult for a person to manipulate the electronic device if it is flush on a table. Thus, the device allows the person to manipulate the positioning of the electronic device when placed on a table (or on the user's lap) and adjust the angle the electronic device is positioned with respect to the table, to allow easier viewing and working access to the electronic device.

Figure 1C:
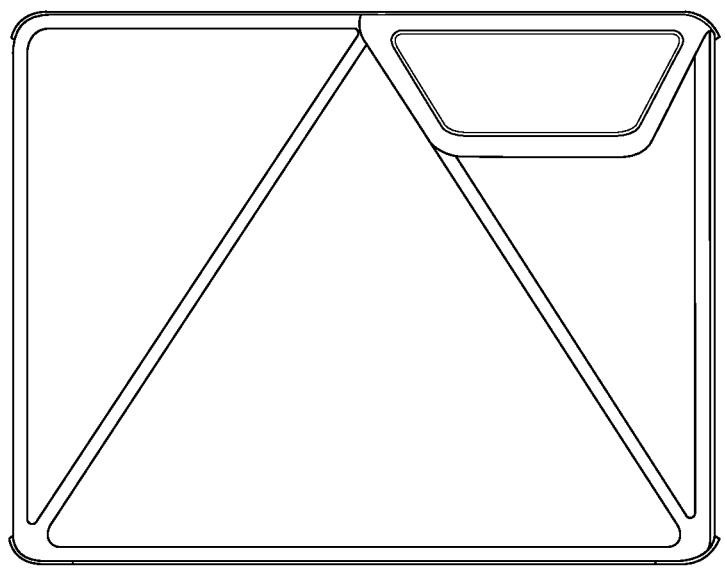

FIGS. 1A and 1C shows a front view of the case, while FIGS. 1B and 1D show a back view. This case protects the portable electronic device (e.g., tablet computer) and also has a built-in stand for the device. The case has a front cover and a back cover, which are attached together. The front cover can be folded into a stand for the device. The back cover protects the back and sides of the device, while the front cover covers and protects the display (e.g., touch screen).

In other implementations, the case may include only the front cover, and not a back cover. The front cover can attach to the tablet directly (e.g., using magnet or other attachment mechanisms and can be used as a cover for the screen and also as a stand. Without a back cover, the back and sides would be exposed.

FIG. 1B shows an implementation of the case with an elastic band 110 or strap attached to the back cover, which can hold the cover closed onto the front of the electronic device. This prevents the screen of the electronic device from damage. The elastic band can be used as a hand band for the user so that the user may obtain a stronger hold or grip on the case when his or her hand is inserted under the elastic band. The back cover has openings that allow access to ports and like features of the electronic device.

In an implementation, the front cover is made from a polyurethane (PU) material. The front cover may be a composite material (e.g., layers of different materials). For example, the front cover can include fiberglass panels (or other relatively rigid material such as plastic or a polymer) sandwiched between two layers of more flexible material such as polyurethane. Between the fiberglass panels, where upper and lower polyurethane materials join together, fabric or crease hinges are formed. The composite may be formed using a welding process. The back cover is made from a polycarbonate (PC) material.

The front cover can be folded into a stand. The front cover has hinges (or fold lines) and a flap 105 that can be folded and positioned in various orientations to allow for multiple viewing angles. In an implementation, the flap is a magnetic flap. In a specific implementation, this built-in stand can accommodate six different viewing angles and positions: (1) a first working angle (landscape orientation); (2) a second working angle (landscape orientation); (3) a third working angle (portrait orientation); (4) a first viewing angle (landscape orientation); (5) a fourth working angle (landscape orientation); and (6) a second viewing angle (landscape orientation).

TABLE A

| Stand Position | Angle Name | Angles (Degrees) | Angle Range (Degrees) |
| --- | --- | --- | --- |
| 1 | First working angle | 8, 9, 10 | 7-12 |
| 2 | Second working angle | 31, 32, 33 | 30-38 |
| 3 | Third working angle | 41, 42, 43 | 40-48 |
| 4 | First viewing angle | 45, 46, 47 | 43-50 |
| 5 | Fourth working angle | 24, 25, 26 | 20-30 |
| 6 | Second viewing angle | 74, 75, 76 | 70-80 |

Although six different viewing angles and positions are described, a built-in stand of the invention may have additional viewing angles or positions (not necessarily described in this application), different viewing angles or positions which replace some of the angles or positions presented, fewer angles or positions or a subset of the angles or positions presented, or angles or positions in a different order than presented, or any combination of these. Further, the angles and positions in other implementations of the invention may not be exactly the same as the angles or positions presented and may be modified or altered as appropriate for a particular application.

Figure 2:
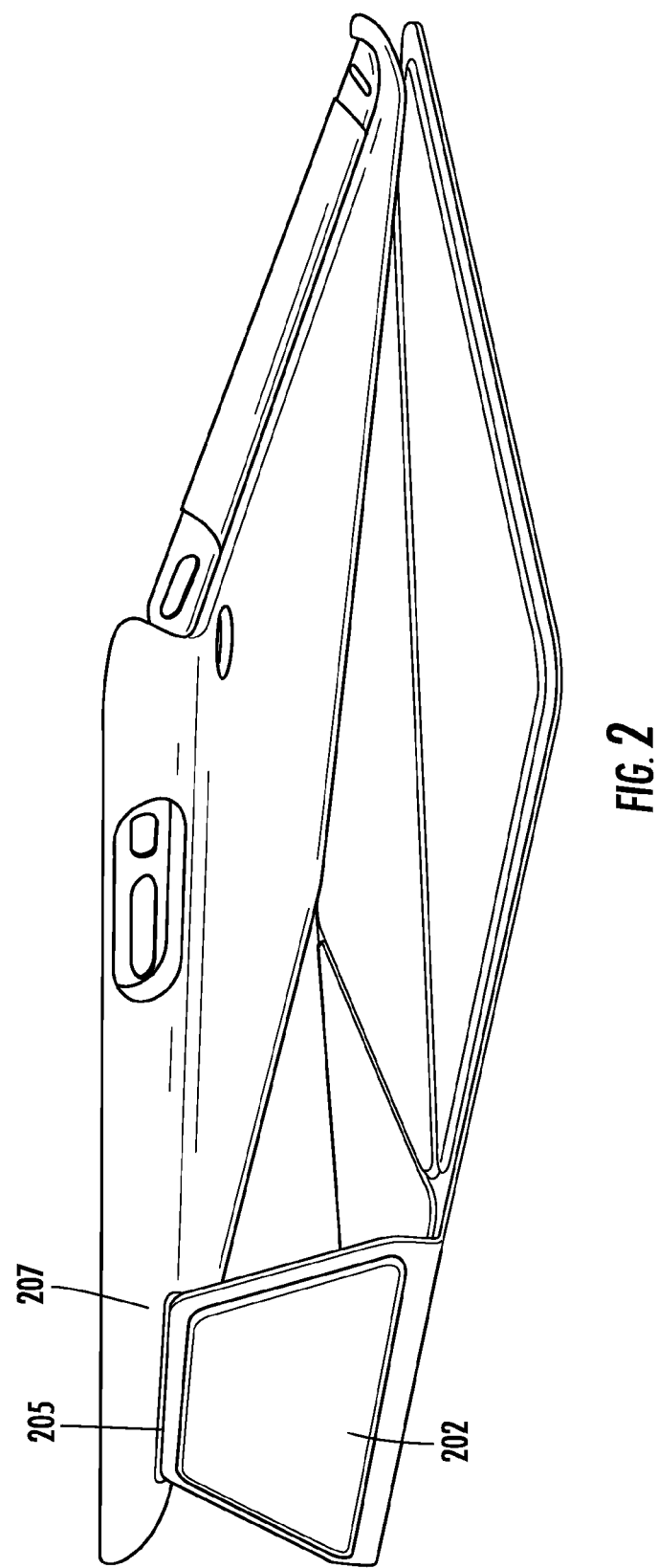
FIG. 2 shows the case folded into a stand for a first working angle, landscape orientation.

In a specific implementation, FIG. 2 shows the front cover folded into a stand (i.e., stand position 1) for the first working angle for the device. The device is in a landscape orientation, where the display is wider than it is tall. To obtain this stand position, a flap 202 of the front cover is rotated away from the remaining portion of the front cover. An edge 205 of the flap is then inserted into a working angle stop 207 (e.g., slot, indentation, or rail) in the back of the back cover (or tablet device when there is no back cover) to hold it in place. In a specific implementation, the length of the stop is about the same length as the edge of the flap, so that the edge of the flap may fit within the stop. In other implementations, the stop may be of other lengths. This flap props the tablet device up to obtain the first working angle. In a specific implementation, the first working angle is from about 7 to about 12 degrees (e.g., 8, 9, or 10 degrees).

FIGS. 3A-3B show the front cover folded into a stand (i.e., stand position 2) for the second working angle for the device. The device is in the landscape orientation. The front cover has two hinges 303a, 303b (not parallel to each other) which allow folding of the front cover so that two adjacent corners 305a, 305b of the front cover can meet together. In this stand position, the two adjacent corners meet (or touch) and also touch an exterior side of the back cover (or tablet device when there is no back cover). Furthermore, the flap 202 of the front cover can be used to hold this stand shape and corner together. In a specific implementation, the second working angle is from about 30 to about 38 degrees (e.g., 31, 32, or 33 degrees). The second working angle is at a greater sloped angle than the first working angle.

FIGS. 4A-4B show the front cover folded into a stand (i.e., stand position 3) for the third working angle for the device. The device is in a portrait orientation, where the device is rotated 90 degrees (or 270 degrees) with respect to the landscape orientation. The display will be oriented so it is taller than it is wide. The front cover is folded similarly as described for stand position 2, but the stand and tablet have been rotated 90 degrees. In a specific implementation, the third working angle is from about 40 to about 48 degrees (e.g., 41, 42, or 43 degrees). The third working angle is at a greater sloped angle than the first working angle and second working angle.

Figure 5A:
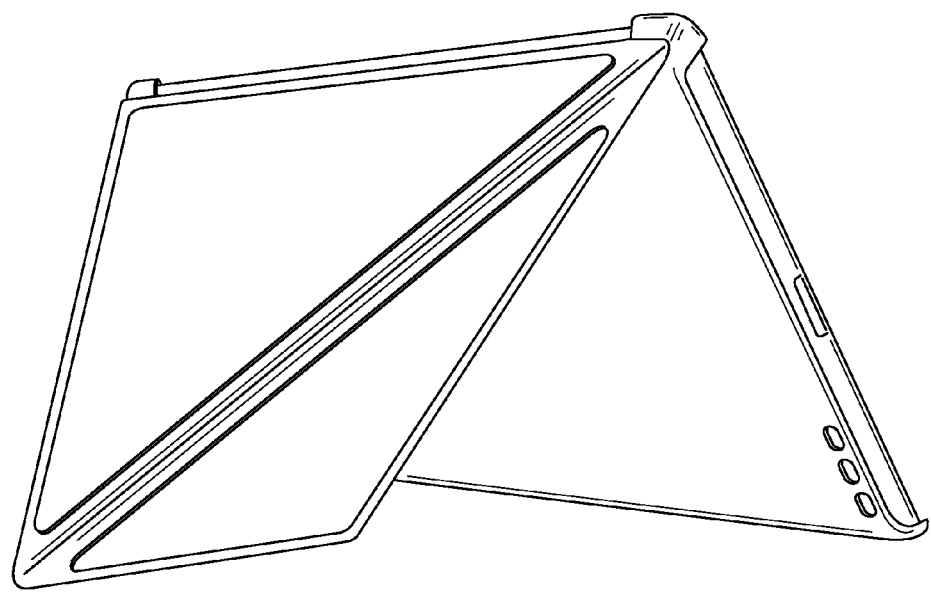
FIGS. 5A-5B show views of the case folded into a stand for a first viewing angle, landscape orientation.
Figure 5B:
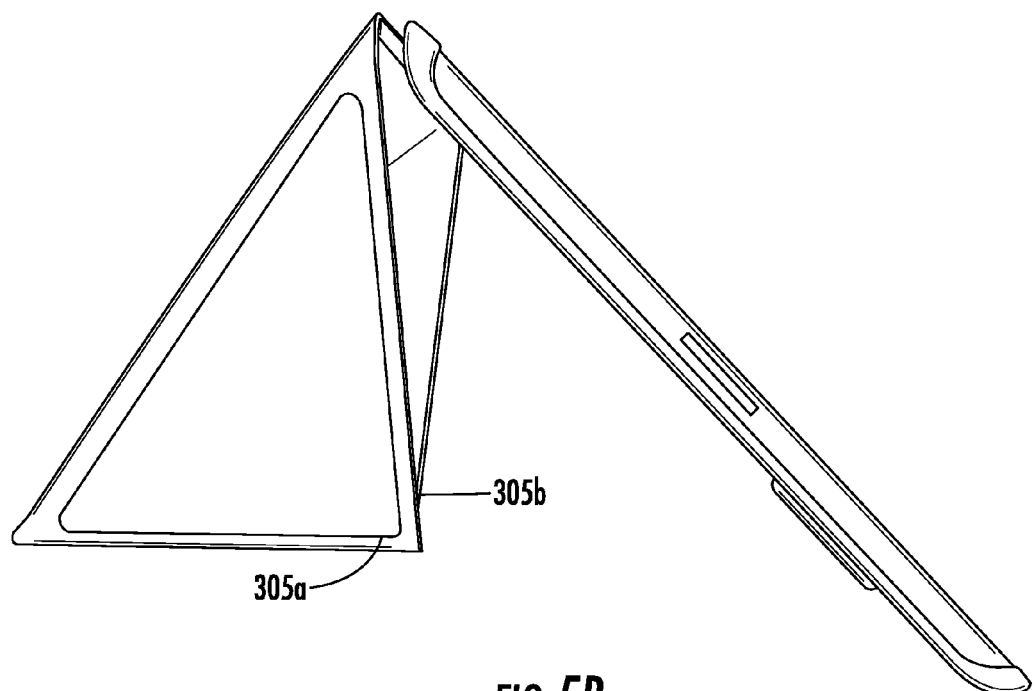

FIGS. 5A-5B show the front cover folded into a stand (i.e., stand position 4) for a first viewing angle for the device, in a landscape orientation. The front cover is folded similarly as described for stand position 2, but the stand and tablet have been rotated 180 degrees. Also, the adjacent corners 305*a*, 305*b* of the front cover meet or touch, but these corners do not touch the exterior side of the back cover or tablet. Rather, these corners may touch a surface on which the stand is set on. In a specific implementation, the first viewing angle is from about 43 to about 50 degrees (e.g., 45, 46, or 47 degrees).

Figure 6A:
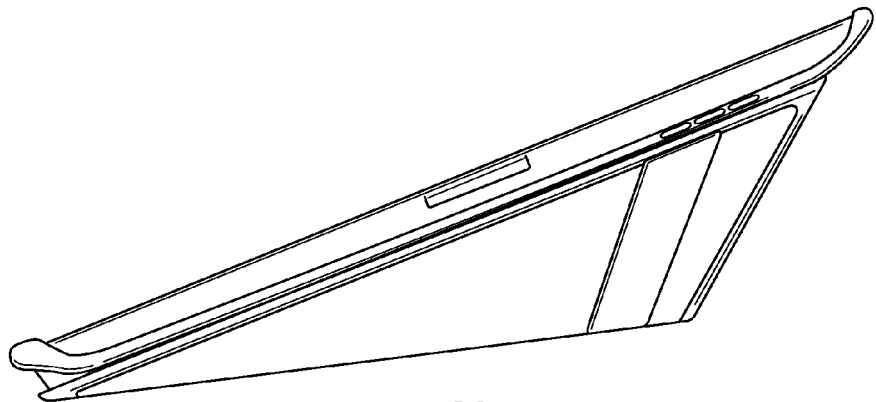
FIGS. 6A-6B show views of the case folded into a stand for a fourth working angle, landscape orientation.
Figure 6B:
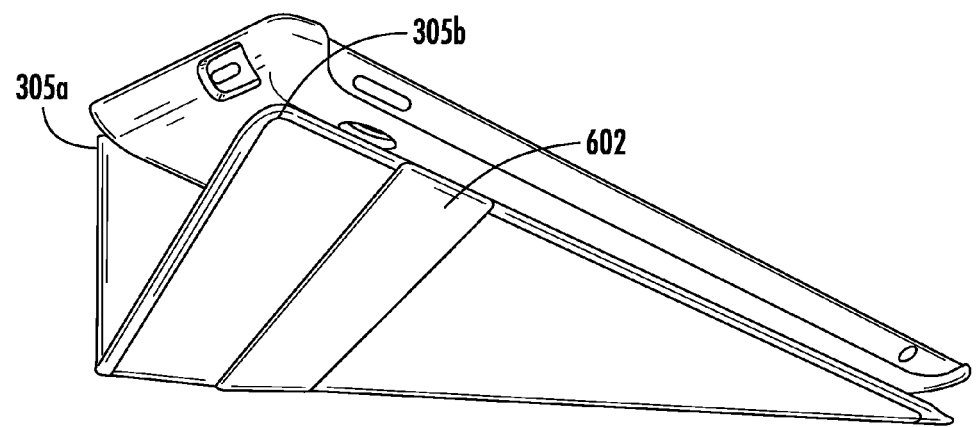
Figure 7D:
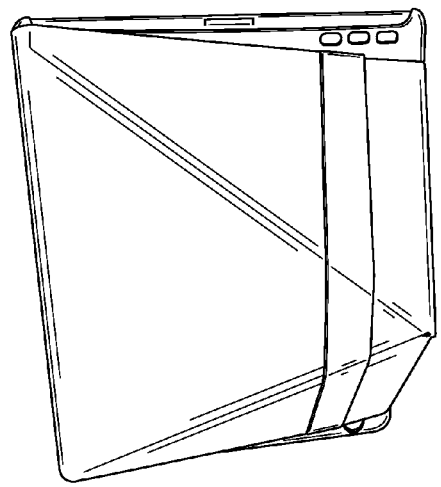
FIGS. 7A-7D show views of case folded into a stand for a second viewing angle, landscape orientation.
Figure 7C:
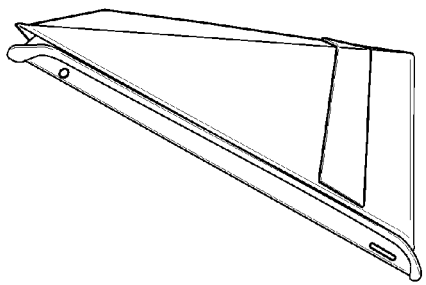
Figure 7A:
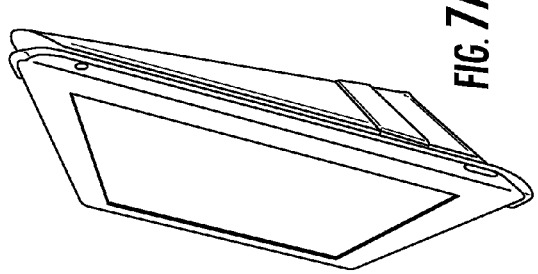
Figure 7B:
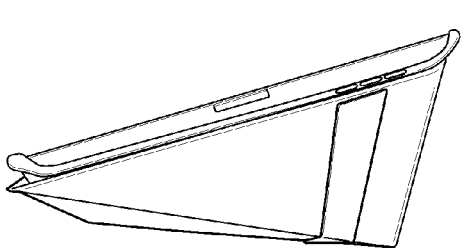

FIGS. 6A-6B show the front cover folded into a stand (i.e., stand position 5) for a fourth working angle for the device, in a landscape orientation. In this stand position, the two adjacent corners 305*a*, 305*b* are rotated toward each other and touch the exterior side of the back cover (or tablet device) at two different points. Unlike stand position 2, the two adjacent corners do not meet or touch. An elastic band 602 attached to the back cover can be used to hold the stand in this stand position. The fourth working angle is less sloped than the second working angle indicated in FIGS. 3A-3B, but more sloped than the first working angle as indicated in FIG. 2. In a specific implementation, the fourth working angle is from about 20 to about 30 degrees (e.g., 24, 25, or 26 degrees).

FIGS. 7A-7D show the front cover folded into a stand (i.e., stand position 6) for a second viewing angle for the device. The device is in the landscape orientation. The front cover is folded similarly as described for stand position 5, but the stand and tablet have been rotated 180 degrees. In a specific implementation, the second viewing angle is from about 70 to 80 degrees (e.g., 74, 75, or 76 degrees). The second viewing angle is more sloped than the first viewing angle.

Figure 8B:
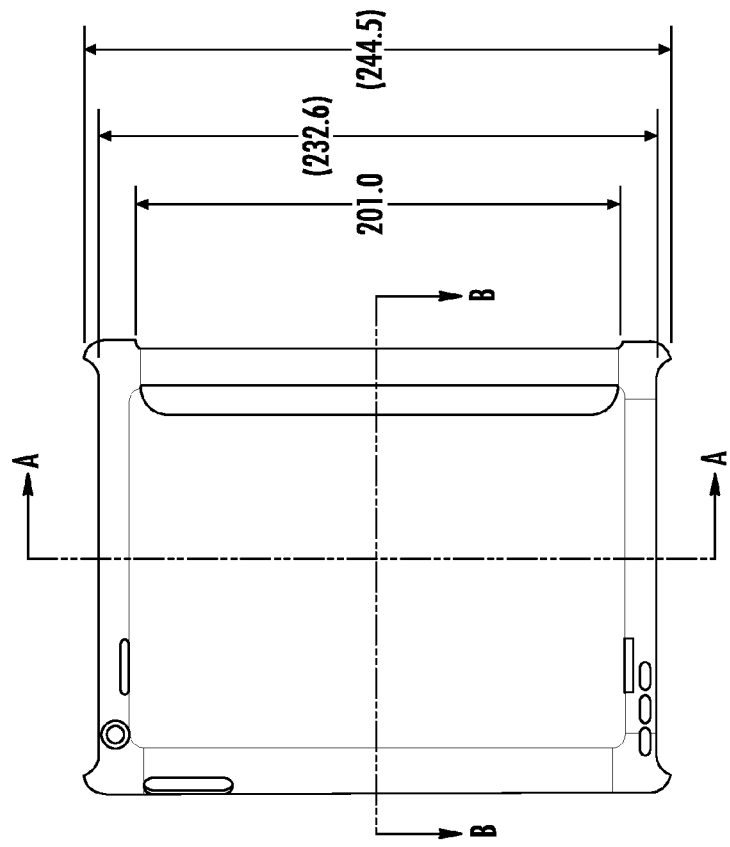
FIGS. 8A-8B show interior and exterior sides of a back cover of the case.
Figure 8A:
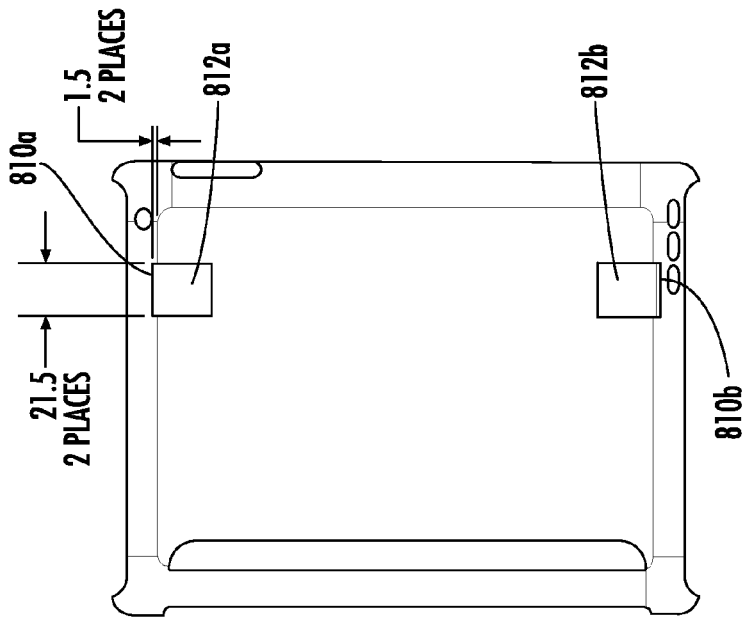

FIGS. 8A-10C show various views of the back cover of the case. The front cover is attached to this back cover. FIG. 8A shows a top view of an interior of the back cover. The device will be inserted into the back cover. The interior of the back cover will touch the back of the device. A flap portion of the front cover attaches to a section of the interior of this back cover. FIG. 8B shows an exterior of the back cover. The back cover has openings for the buttons, jacks, and other various ports of the specific device. In a specific implementation, the exterior side of the back cover can also have a working angle stop (not shown).

Figure 9A:
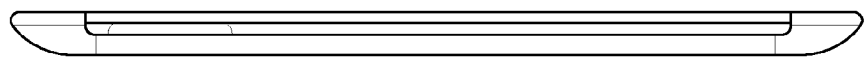
FIGS. 9A-9C show side views and a cross-sectional view of the back cover from a first direction.
Figure 9B:
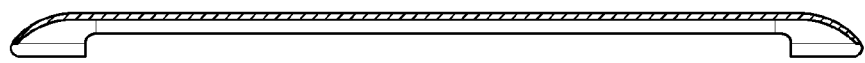
Figure 9C:
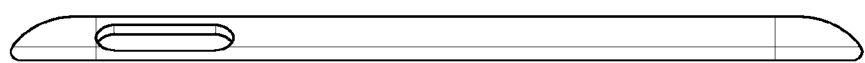

FIG. 9A is a side view for an edge of the back cover from a direction A (as indicated in FIG. 8B). FIG. 9B is a cross-sectional view of the back cover at line A of FIG. 8B. FIG. 9C is a side view for an edge of the back cover from a direction opposite of direction A.

FIG. 10A shows a side view for an edge of the back cover from a direction B (as indicated in FIG. 8B). FIG. 10B is a cross-sectional view of the back cover at line B of FIG. 8B. FIG. 10C is a side view for an edge of the back cover from a direction opposite of direction B.

The back cover of the case may be constructed with rigid, hardened material, for a hard shell construction around the electronic device. The electronic device may be fitted to the back cover by "snapping in" the four corners of the device in specifically designed slots on the corners of the bottom cover of the device to hold the electronic device. The case may also include a rubberized exterior durability and (grip) purposes. The sides and covers of the device may also include openings that allow direct access to ports and other features of the electronic device enclosed within.

An elastic band may be attached lengthwise to the exterior of the back cover. A portion or portions of the elastic band can be attached to the back cover. For example, the elastic band may attach to a section or sections, of various size and shape, of the interior of the back cover. The elastic band may attach by stitching, by an adhesive, by bonding, or by other attachment mechanism.

Referring to FIG. 8A, the elastic band will be inserted through two slots in the back cover and attached at two sections of the back cover interior. For example, a first end of the elastic band can be inserted into a first slot 810*a* in the back cover, and a second end of the elastic band can be inserted into a second slot 810*b* in the back cover. The first end can be coupled to a first section 812*a* and the second end coupled to a second section 812*b*. In this specific implementation, the two attachment sections are rectangular shaped (e.g., rectangles, squares), to align with the edges of the elastic band. A width of these two rectangularly shaped surfaces is about 21.5 millimeters. One edge of each square surface is a slit 810*a*, 810*b* that is cut through the material of the back cover, so that the elastic band may be flatly threaded through the slits. The elastic band will lie flat lengthwise on the exterior of the back cover. Each slit is about 1.5 millimeters thick. These slits are shown in FIG. 8B in greater detail.

In a specific implementation, the length of the case is about 244.5 millimeters, from a tip of a top corner to a tip of a bottom corner, as shown in FIG. 8B. A length of the case is about 232.5 millimeters, from a top edge to a bottom edge as shown. The length of a flat surface region of the back cover, which contacts a tabletop or work surface when the case is laid flat, is about 201 millimeters, from a top edge to a bottom edge as shown.

In a specific implementation, the case dimensions can accommodate an electronic tablet having approximately a 9.7-inch (diagonal) screen size. A height of the device is about 9.5 inches or 241.2 millimeters. A width of the device is about 7.31 inches or 185.7 millimeters. A depth of the device is about 0.37 inches or 9.4 millimeters. The dimensions of the case can vary to accommodate the electronic device (e.g., tablet) being housed.

FIG. 10A shows a side view for an edge of the back cover from a direction B (as indicated in FIG. 8B). In a specific implementation, a depth of the back cover is about 12.1 millimeters. The thickness of the flat cross-sectional area, at line B of FIG. 8B, of the back cover is about 2 millimeters. These dimensions of the case can vary to accommodate the electronic device being housed, and may also be adjusted depending on the type of material used.

Figure 11:
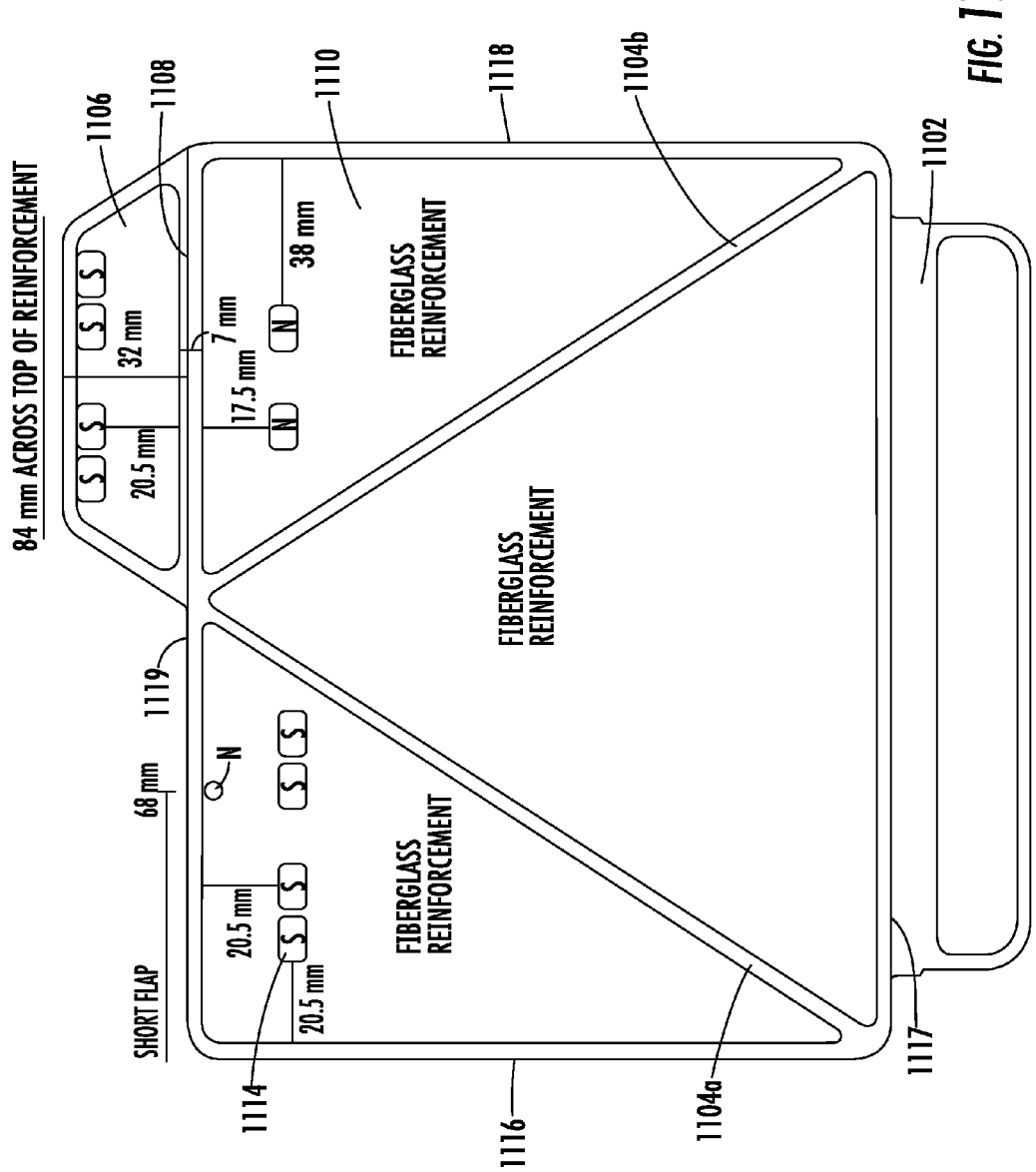
FIG. 11 shows a schematic for a front cover.

FIG. 11 shows a schematic of a specific implementation of the front cover of the case. The front cover has a first flap portion 1102 that can attach to a section of the interior of the back cover, as indicated in FIG. 8A. As described above, the case has a front and back cover, with a spine section connecting the front and back covers, which acts as a hinge that allows the front and back covers to open and close.

Further the front cover includes three triangular sections, each separated from another by a fold line or hinge. The front cover has a first fold line 1104*a* and a second fold line 1104*b*. The front cover includes a second flap 1106 which is attached to an edge of the front cover which is opposite the first flap. In a specific implementation, the second flap has a trapezoidal shape, but in other implementations, the second flap may have a different shape. For example, the second flap can have a shape of a quadrilateral, parallelogram, rectangle, square, triangle, or other. The second flap is joined to the front cover using a fold line 1108 or hinge. When the second flap is folded to touch the front cover, the second flap touches a panel section 1110. In a specific implementation, the panel section is a triangle shape as shown.

When the case is closed as in FIG. 1A, the front cover has first 1116, second 1117, third 1118 and fourth 1119 edges, with the first and third edges shorter than the second and fourth edges. The second edge is closest to the spine connecting the front and back covers. The fourth edge is opposite the second edge, and the fourth and second edges are parallel.

In a specific implementation, the first fold line 1104a extends from a first corner of the front cover to the fourth edge. The second fold line 1104b extends from a second corner of the front cover to the fourth edge. The first and second fold lines meet together. The first and second fold lines form panel regions in the front cover. In this implementation, there are three panels. Each panel has a triangle shape.

The second flap extends from the fourth edge. The flap may open and close. In a closed position, the flap folds over onto the front cover in a flat, overlaying position. In an open position, the flap protrudes from the fourth edge, as shown in FIG. 11. The flap is substantially a trapezoidal shape, with a long edge and a short edge, and a first sloped edge and a second sloped edge. The two sloped edges are shorter than either of the long or short edges. In an implementation, the flap extends from the third edge to the point at which the two fold lines meet. In other implementations, the flap may be positioned on the opposite end of the fourth edge, such that it extends from the first edge of the front cover to the point at which the two fold lines meet. When the flap rests closed over the front cover, one sloped edge aligns with one of the fold lines.

Figure 12:
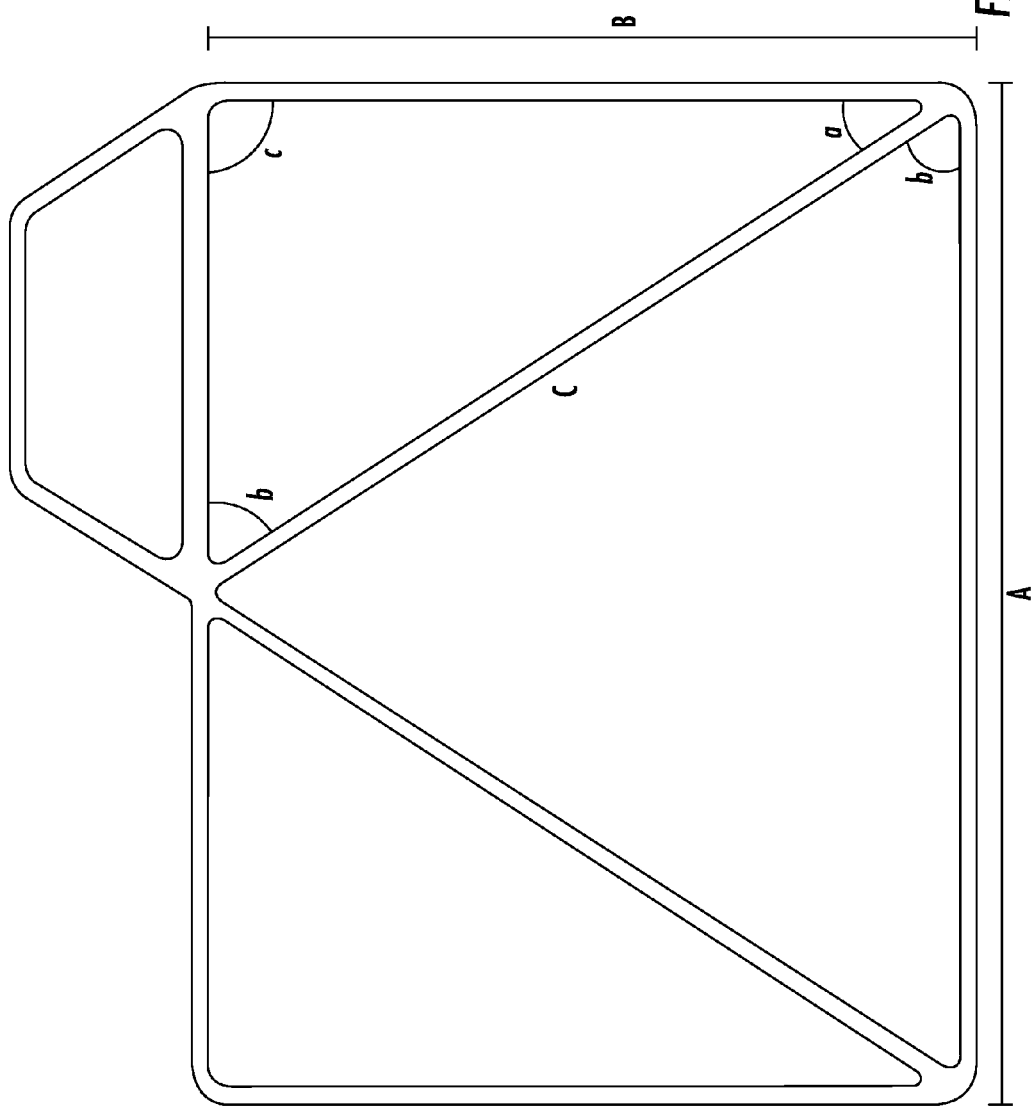
FIG. 12 shows the front cover with various angles and lengths indicated.

FIG. 12 show a diagram of the angles at which the fold lines of the front cover are positioned. The width of the front cover is indicated by a variable B, and the length of the front cover is indicated by a variable A. The length of one fold line is indicated by C. These three edges form a right triangle with three legs, wherein the length of the hypotenuse of the triangle is C, the length of the leg adjacent the hypotenuse is B, and the length of the leg opposite the hypotenuse is A/2.

According to principles of geometry, the length of hypotenuse C and the particular angles a and b of the right triangle may be calculated, where angle c is 90 degrees:

TABLE B

| C = square root ((A2/4) + B2) | |
|---|---|
| a = arctangent (A/2B) | |
| b = 90° − a    or | b = arctangent (2B/A) |

As described above, the case is for a tablet computer, tablet PC, other tablet-type electronic device, smartphones, personal digital assistants (PDAs), handheld computers, notebook computers, or other portable electronic devices. Depending on the particular electronic device, the dimensions (i.e., length, width and depth) of the case can be adjusted accordingly to fit the particular electronic device being housed. The formulas above can be applied to any combination of length and width dimensions to calculate the lengths of the fold lines, and the angles at which the fold lines are positioned on the front cover.

Returning to FIG. 11, the flap may be secured to the front cover by one or more magnets 1114 embedded into the flap and front cover. This prevents the flap from opening up unintentionally.

There are magnets embedded within the layers of the particular material of the front cover as shown in FIG. 11. Various magnets are used for securing the front cover to the electronic device in a closed position. The magnets also function to secure the panels 1110 of the front cover when folded into various positions for a stand, while other magnets are positioned to secure the flap onto the front cover when it is folded overtop the front cover in a flat, closed position.

FIG. 11 shows a specific implementation, where there are approximately seven magnets positioned along the fourth edge of the front cover. There are approximately two magnets, of north (N) polarity facing up, positioned at panel 1110. Typically, magnets have two ends, north and south polarity. North polarity ends are attracted to south polarity ends of other magnets, while north polarity ends repel the north polarity ends of other magnets. So, the opposite side of these two magnets will have a south (S) polarity.

Both are situated in a line parallel to the fourth edge, about 17.5 millimeters from the edge. The magnet closest to the third edge lies about 38 millimeters from said edge. Corresponding to these magnets are approximately four magnets, of S polarity, embedded in the flap, which are positioned in the second flap. Each magnet is about 20.5 millimeters from the hinge connecting the flap to the front cover. When the flap is opened and extended flat, the width of the material forming the hinge is about 7 millimeters. Either some or all of these magnets attract to the corresponding N polarity magnets of the front cover, thereby securing the flap over the front cover.

More magnets can be positioned in other panels of the front cover. In the specific implantation of FIG. 11, there are approximately four magnets, of S polarity, positioned on a second panel of the front cover. The magnets can be in a linear arrangement, about 20.5 millimeters from the fourth edge. A magnet closest to the first edge of the front cover is positioned about 20.5 millimeters from the first edge. The magnets are not evenly spaced, but in other implementations, the distances between each magnet can be the same. There is a magnet of N polarity that is not situated in the linear arrangement of the S polarity magnets. It is positioned about 68 millimeters from the first edge.

Figure 13:
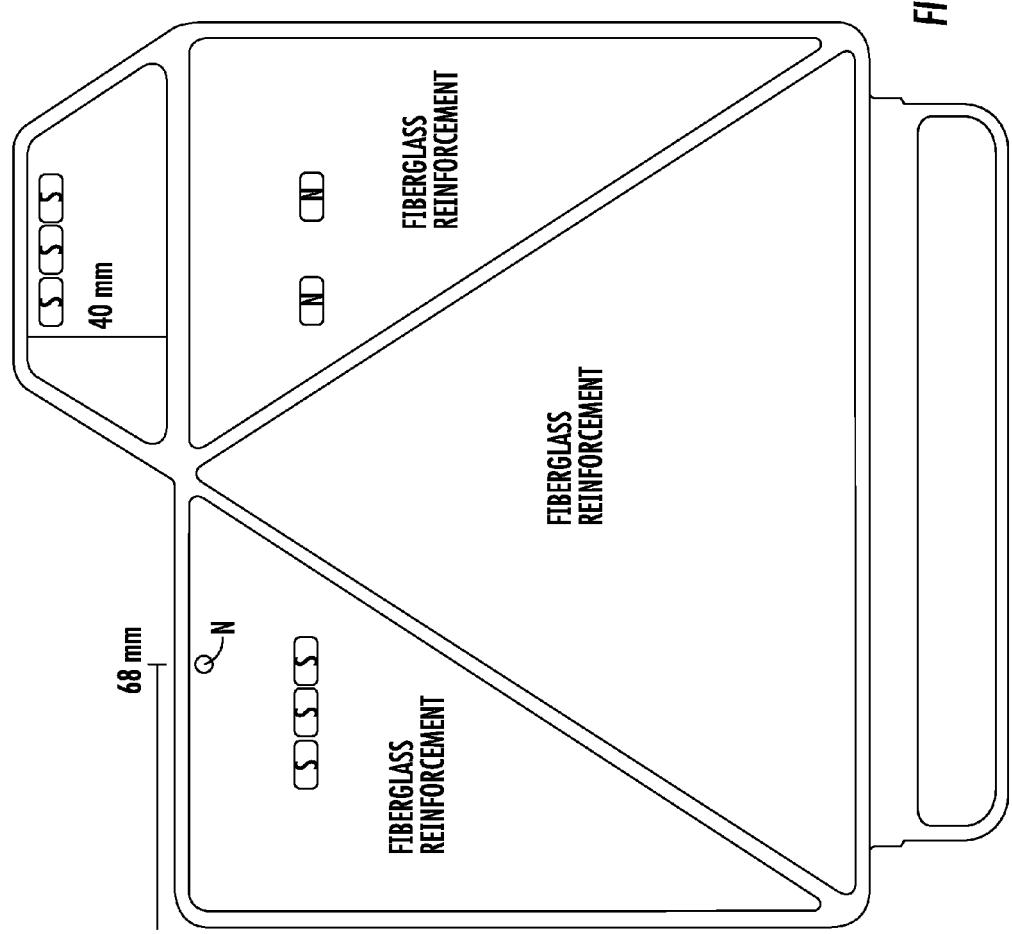
FIG. 13 shows a schematic for another implementation of the front cover.

FIG. 13 shows a schematic diagram of a second specific implementation of the front cover of the case. A width of the flap is about 40 millimeters. There are approximately six magnets of S polarity. A first group of these magnets are positioned on the flap, and a second group of these magnets are positioned on the front cover in a first panel section. A third group of N polarity magnets are situated on the front cover in a second panel section. Within each group, the magnets can be evenly spaced. For example, the distances between adjacent magnets are approximately the same. In other implementations, the distances can be different. A magnet of N polarity is positioned along an edge of the front cover. This magnet can be used to control a sleep mode and a wake mode of the electronic device. In this specific implementation, this magnet is about 68 millimeters from an edge of the front cover. This distance can vary depending on the particular device house or the application.

Figure 14:
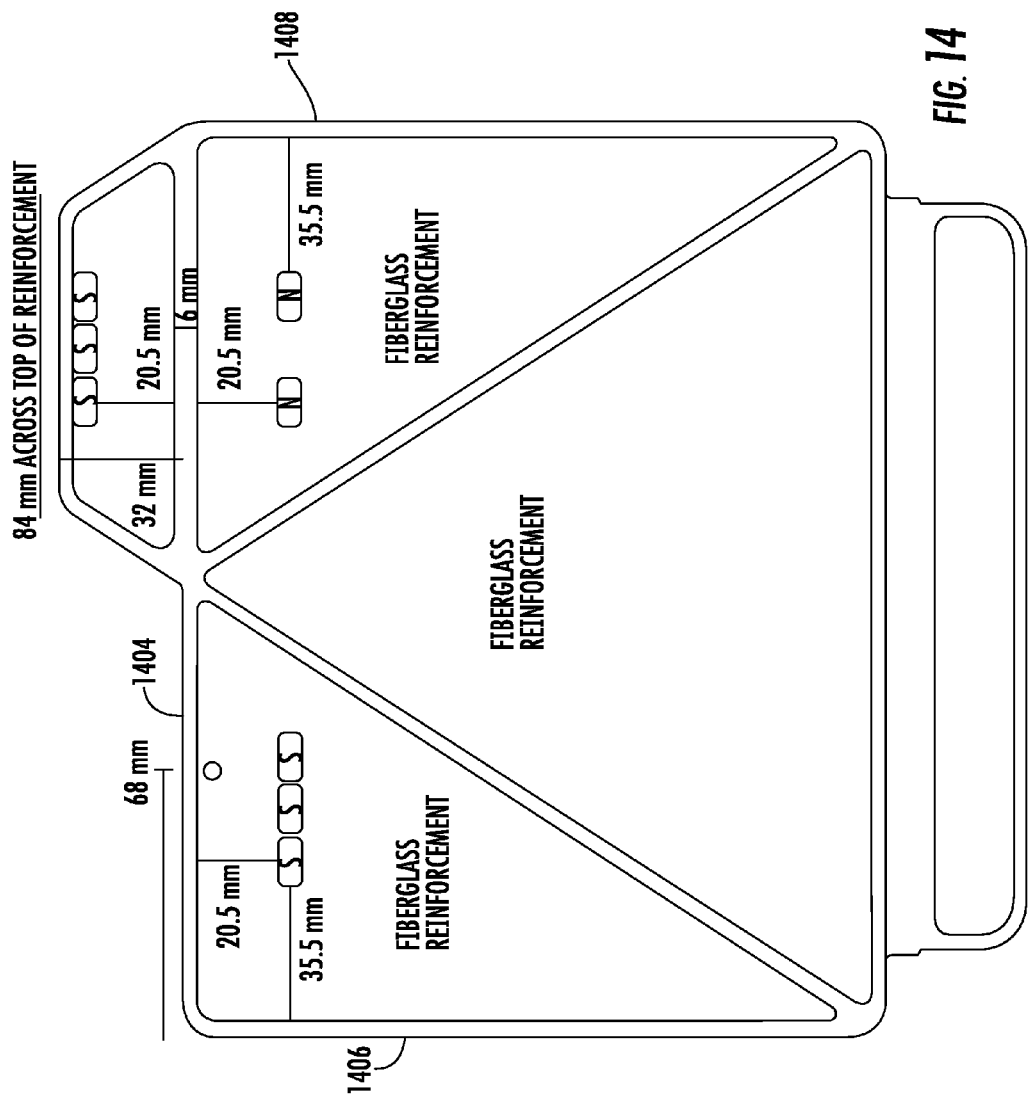
FIG. 14 shows a schematic for another implementation of the front cover.

FIG. 14 shows a schematic diagram of a third specific implementation of the front cover of the case. Similar to the second implementation, there are approximately two groups of magnets of S polarity. A height of the flap is about 32 millimeters and a length of a first edge of the flap is about 84 millimeters. A width of a hinge between the front cover and the flap is about 6 millimeters. A first group of S polarity magnets on the front cover is situated about 20.5 millimeters from a first edge 1404. Within this group, a first magnet is positioned about 35.5 millimeters from a second edge 1406. A group of N polarity magnets is positioned about 20.5 millimeters from the first edge. A magnet in this group is about 35.5 millimeters from a third edge 1408.

Figure 15:
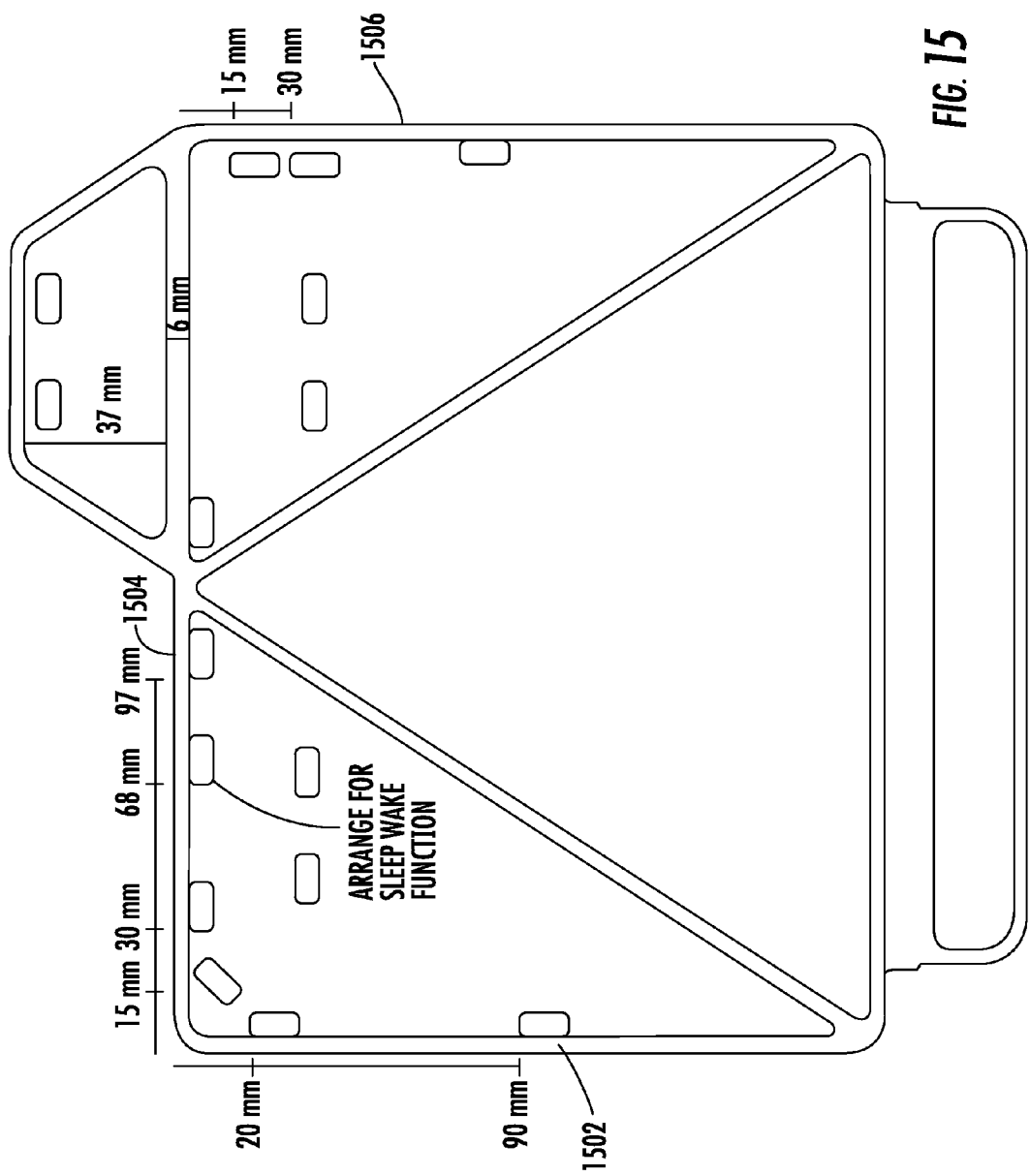
FIG. 15 shows a schematic for another implementation of the front cover.

FIG. 15 shows a schematic diagram of a fourth specific implementation of the front cover of the case, showing a specific arrangement of the magnets. The magnets are positioned along the outer edges of the front cover. A first group of magnets is along a first edge 1502. A first magnet of the group is positioned closer to a second edge 1504 than a second magnet. A second group of magnets is along the second edge.

A first magnet is positioned at an angle with respect to the second edge, and is about 15 millimeters from the first edge. A second magnet is positioned about 30 millimeters from the first edge; a third magnet is positioned about 68 millimeters from the first edge; and a fourth magnet is positioned about 97 millimeters from the first edge. The third magnet can be programmed for a sleep-wake function, wherein the opening of the front cover automatically turns on the electronic device from a sleep mode, and closing the front cover automatically returns the device to the sleep mode.

A third group of magnets is positioned along a third edge 1506 of the front cover. A first magnet of the group is positioned closer to the second edge than a second magnet and a third magnet. The second magnet is between the first magnet and the second magnet. A fourth group of magnets are positioned in a line that is parallel to the second edge. The third group is farther away from the second edge than the second group. They can be arranged in two rows of two magnets, where a first pair is positioned closer to the first edge, and a second pair is closer to the third edge. The second pair can align with a pair of magnets positioned on the flap. The polarities of these magnets will be a combination of magnets of N polarity ends and S polarity ends. A width of the flap is about 37 millimeters, and a width of the hinge is about 6 millimeters.

FIG. 16 shows the flap in an open and closed position. When it is in the closed position, the user may pull the elastic band over from the back cover around to the front cover, to hold down the flap against the front cover of the case. The shadowed box of FIG. 16 indicates where a logo (or design) may be positioned on the flap. The length and width of the text will vary depending on the specific logo. To ensure that the logo may still remain visible when the elastic band is covering the front cover, the logo is offset from the edges of the flap.

In a specific implementation, the logo may be positioned about 5 millimeters from one edge of the flap, and about 6 millimeters from a second sloped edge of the flap. The length of the logo is approximately 38 millimeters. The elastic band is about 40 millimeters from the fourth edge of the front cover. These measurements may be subject to change depending on the specific logo used.

FIG. 17 is a more detailed view of FIG. 15 as described above.

FIG. 18 shows a schematic diagram of an specific implementation of the front cover of the case, where there are approximately five fold lines. The fold lines extending from corners of the front cover to meet together. A fold line extends from an edge of the front cover to a point at which the fold lines meet. In addition, this implementation omits a flap. In a specific implementation, the front cover has a length of about 240 millimeters and a width of about 168 millimeters. The hinges of the fold lines and the outer edges are about 4 millimeters wide.

Table C provides a specific example of a flow for making the case. It should be understood that the invention is not limited to the specific flows and steps presented. A flow of the invention may have additional steps (not necessarily described in this application), different steps which replace some of the steps presented, fewer steps or a subset of the steps presented, or steps in a different order than presented, or any combination of these. Further, the steps in other implementations of the invention may not be exactly the same as the steps presented and may be modified or altered as appropriate for a particular application or based on the data or situation.

TABLE C

| | |
|---|---|
| Step 1 | Form front cover, with hinges. |
| Step 2 | Form back cover. |
| Step 3 | Position elastic band on back cover and attach. |
| Step 4 | Attach front cover to back cover. |

In step 1, to form the front cover, there is a rectangular sheet of material cut to the desired dimensions to form the case. For example, a length of the material may be about 240 millimeters and a width of about 185 millimeters. Regarding the first and second flap portions, the length of the front cover material may be about the same length or greater to the length of the first flap, and about two times or twice the length of the second flap. A single sheet layer may be used. For example, the single layer may be a thermoplastic or other plastic or polymer.

Alternatively, multiple or composite sheets or layers of different materials may be used. Leather, synthetic leather, or vinyl can be used to sandwich a more rigid material or stiffening layer, such as flexible plastic, cardboard or a fiberglass reinforcement. In an implementation, the front cover is made from a polyurethane (PU) material. Other various materials can be used for the front cover, including microfiber, velvet, silicone, rubber, fabric, and carbon fiber. An additional layer may be a foam or other padding material. A foam or padding layer can help to provide cushioning for the electronic device. The composite layers can be combined or attached together by stitching, adhesives, bonding, glue, fusing, or the like. There can be layers other than those described above.

For example, there can be first and second flexible layers and three rigid or stiffening (or padding such as foam, or both) layers. The rigid layers are to be sandwiched between the first and second flexible layers. The rigid layers will form panels of the front cover. The first flexible layer will form the outside surface of the front cover. The second flexible layer will form the inside surface of the front cover. The first and second flexible layers have about the desired dimensions of the front cover when the front cover is laid flat and open. The composite layers can be combined or attached together by stitching, adhesives, bonding, glue, fusing, or the like.

In an implementation, the front cover includes fiberglass panels sandwiched between two layers of more flexible material such as polyurethane (PU). Polyurethane provides a smooth, nonslip outer layer for the front cover, while the relatively more rigid fiberglass panels provide a more impact-resistant covering for the screen of the electronic tablet. In addition, the fiberglass panels form the rigid parts of the stand when the front cover is folded into various stand positions. The fiberglass panels provide structure and strength for the stand so that the stand can support a device such as a tablet computer (e.g., weighing from about 0.5 pounds to about 6 pounds), and any other weight or force that a user may subject the stand to. Under such circumstances, the stand will become unstable or collapse.

To form a single composite cover from the multiple layers, the upper and lower layers that sandwich the middle layer of more rigid material (e.g., fiberglass, plastic, or polycarbonate) are joined together. In a specific implementation, the upper and lower layers are sealed, welded, or otherwise fused together, sandwiching the rigid material panels in between. Between the rigid panels, seams are formed where the upper and lower layers are directly fused together. These seams form fabric or crease hinges, which allow the rigid panels to bend and swing about the fabric hinge.

In a specific implementation, the hinges are visible crease lines in the front cover. The material (e.g. polyurethane) at the crease line can be flexed in a hinge-like fashion, allowing the fiberglass panels connected by a hinge to swing or rotate with respect to each other. Other techniques may not result in visible creases in the material. These hinges may be referred to as hidden or invisible hinges, but these hinges allow panels connected by a hinge to swing or rotate with respect to each other.

The edges of the front cover are sealed by adhesives, bonding, welding, glue, fusing, or the like. In a specific implementation, as shown in FIG. 11, the edges and the diagonal fold lines are about 3 millimeters in width.

Alternatively, instead of a three-layer composite, the front cover can include additional layers (e.g., more than three layers) or less than three layers (e.g., two layers). For example, a two-layer cover can be constructed similarly to the three-layer cover described above, but one of the flexible material layers is omitted. In this case, the exterior of the front cover can be the polyurethane and an interior of the front cover (which touches the tablet screen) is the fiberglass, or vice versa. Also, the exposed fiberglass can be sprayed with otherwise coated with a polymer. Also a single layer implementation of the front cover can be made from one material (e.g., plastic, polycarbonate, polypropylene, or polyethylene) and living hinges are created in the material. A living hinge is a thin flexible web of material that joins two rigid bodies together. Also, the hinge for the front cover may include resins like nylon and acetal. Many other variations of front cover are possible.

In step 2, the back cover may be formed using a mold. Various manufacturing techniques may be used, including injection molding, among many others. There is a mold of the back cover. A liquid or uncured plastic is injected or poured into the mold along with a catalyst, which is then subject to a temperature to activate the catalyst and material. After a sufficient time for processing to occur, the mold can be opened and the back cover removed. The mold used in the processing can include features that will form features of the back cover described in this application. The mold will have regions where material will be raised and curved (e.g., four corners) and regions where material will be absent. For example, various openings, holes and slits in the back cover are present to allow for access to buttons, ports, camera lens, and other functional elements on the electronic device. In a specific implementation where the back cover has an elastic band connected thereto, there are slits cut into the back cover which allow the elastic band to be thread through.

Alternatively, the material of the back cover may be die cut with openings appropriate for the electronic device. Other manufacturing techniques to make a hole include cutting, punching, or drilling.

In a specific implementation, the back cover is formed using a polycarbonate (PC) mold. This construction provides a thin, light, and durable design, with a smooth finish. The elasticity of the PC material permits the case to be elastically deformed, thereby enlarging the four corners of the back cover when the electronic device is inserted and permits the device to be "snapped in" to the back cover. In this implementation, unlike for the front cover which includes multiple layers (e.g., thermoplastic polyurethane and fiberglass), the outer cover is made of a single type of material—polycarbonate. In other implementations, the back cover may be coated with a laminate layer.

In step 3, in the implementation with an elastic band, the elastic band is provided as a strip, i.e., having an end and an opposite end. In another specific implementation, the elastic band is provided as a loop, i.e., a continuous strip or circle of band material.

The band may be referred to as a belt, strap, strip, or cord. Typically, the band is thin so that it remains unobtrusive. A cross section of the band is rectangular and when viewed in cross section the band has a length that is substantially greater than a width. Alternatively, the band can be thick. The band can have a square cross section or a circular cross section (e.g., bungee cord).

In a specific implementation, the band includes an elastic type material that is capable of being easily stretched and recovering size and shape after deformation. The band may include materials such as rubber, spandex (e.g., polyurethane-polyurea copolymer), silicone, gum, latex, cloth, fabric, nylon, leather, or combinations of these.

The elastic band is attached to the interior of the back cover by adhesive, sewing, bonding, or other attachment technique. The elastic band may be flatly threaded through the slits that have been cut, or molded, into the material. The elastic band will lie flat lengthwise on the exterior of the back cover. In a specific implementation, as shown in FIGS. 8A and 8B, each slit is about 1.5 millimeters thick.

In a specific implementation, a working angle stop may be cut into the back cover. The length of the stop may be about the same as the length of the edge of the second flap of the front cover. Other stop mechanisms may be used to retain the edge of the flap to keep the stand for the case stationary at the selected first working angle. In another specific implementation, there are one or more rails or other projections that emerge or project above the surface of the back cover. The projections may be protrusions, anchors, levees, studs, posts, and the like.

In a specific implementation, the projection is an extra layer of material attached to the back cover surface. For example, a strip of material is attached (e.g., glued or fused) onto the back cover surface to form the rails. Alternatively, the rails or projections may be molded as part of the flat base surface. Also, the strips of material may attached to an inner layer of the back cover. Then, the outer layer will also have a protrusion caused by the inner strips of material.

In step 4, the front cover is attached to the back cover to finish the case. In an implementation, the first flap of the front cover is positioned over a section of the interior of the back cover, as shown in FIG. 8A. The first flap and this section of the back cover may be stitched together along the edges of the pieces. Optionally, an adhesive or glue may also be used between the first flap and the back cover.

Figure 19D:
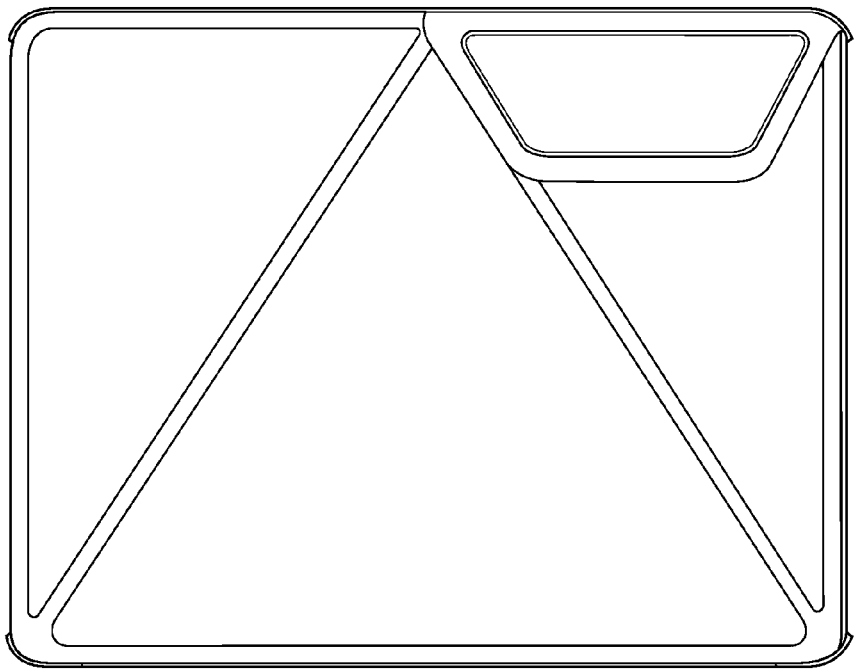
Figure 19C:
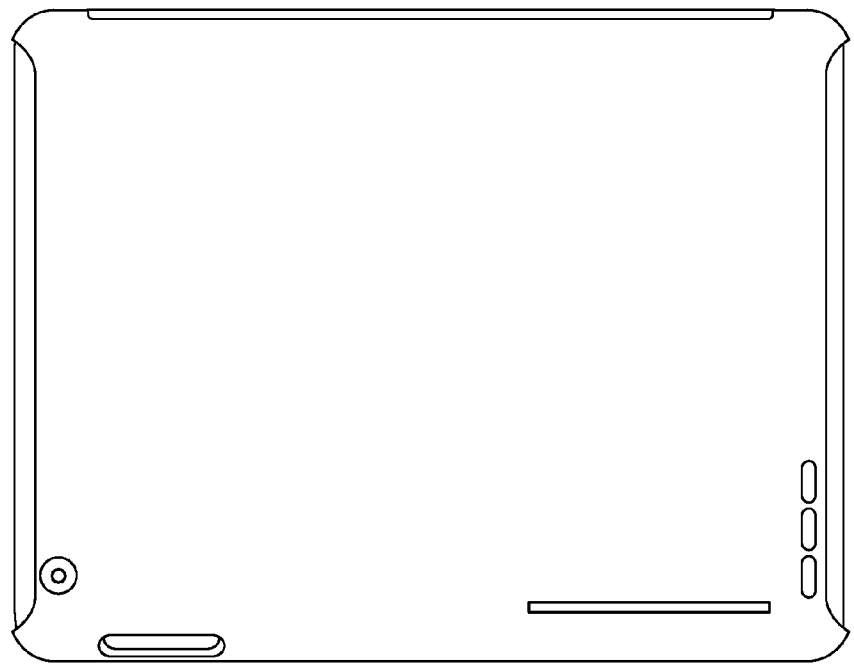

FIGS. 19A-19D show a specific implementation of the case as described in FIGS. 1A-1D, without an elastic strap. FIGS. 19A and 19D show front views of the case. The front cover has hinges (or fold lines) and a flap 1910 (e.g., a magnetic flap) that can be folded and positioned in various orientations to allow for multiple viewing angles. The cover includes reinforced polyurethane (PU) material. FIG. 19B shows a back view of the case. The back cover includes a stop 1920 (e.g., a groove) to allow the case to be folded and positioned in a working angle where the flap can be positioned in the groove. The back cover includes polycarbonate (PC) material that provides a clean back side to the case. The back cover has openings that allow access to ports and like features of the electronic device. FIG. 19C is a similar back view of the case.

For a case, the elastic strap can be an option. With the elastic strap, the case is as described above in FIGS. 1A-7D, providing the angles indicated. The elastic strap can be used to hold the front cover closed while the tablet is being transported. The elastic strap can also be used to hold the case open, so the front cover is strapped against the back cover. Also, the user can insert a hand underneath the elastic strap, which helps the user more securely hold the case and tablet. Without the elastic strap, the case is similar but may omit some stand angles where the elastic strap is used to hold the front cover. The case back has a "cleaner" polycarbonate (PC) back side when there is no elastic strap.

Figure 20A:
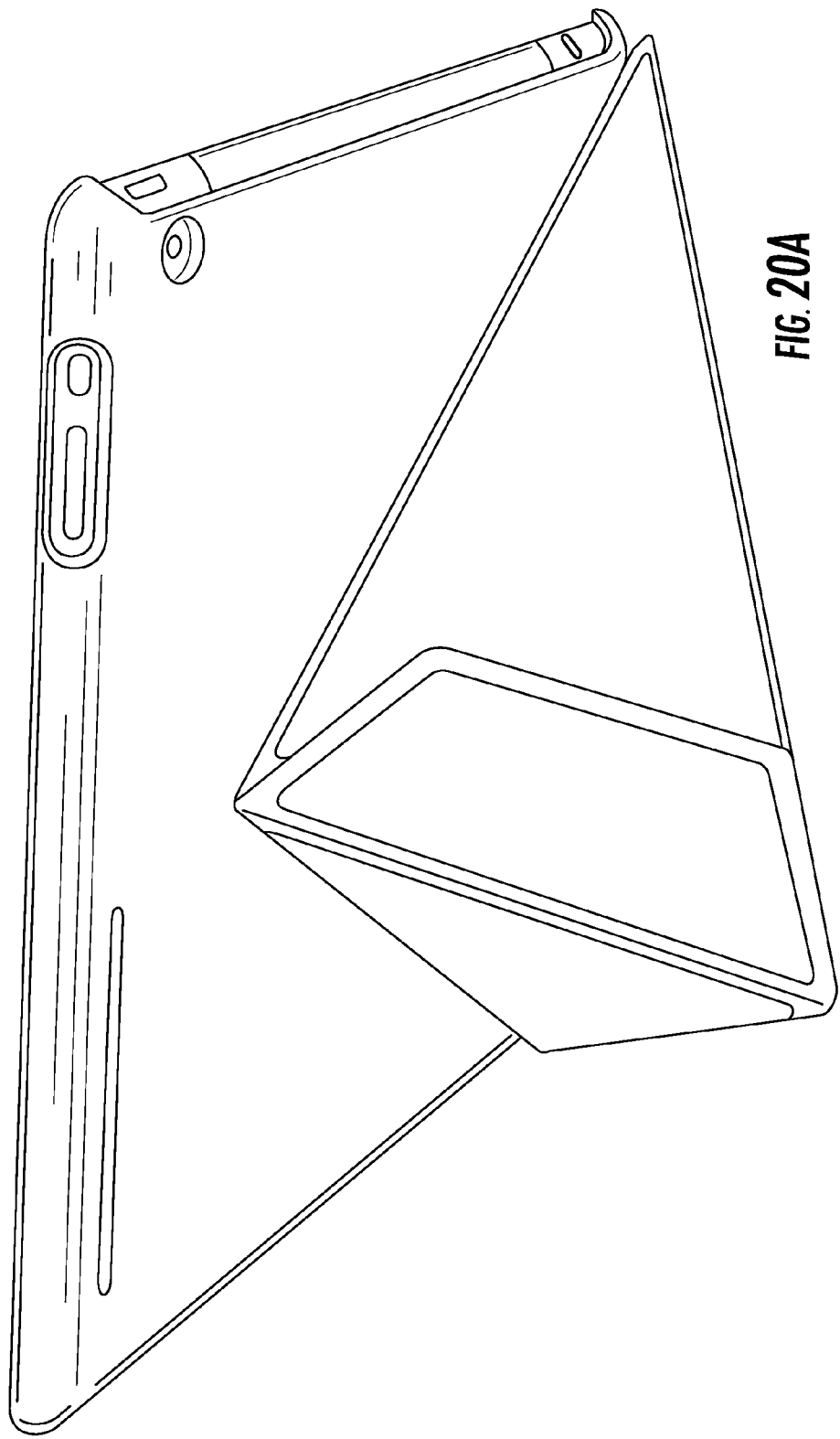
FIG. 20A shows the case folded in a stand position.

FIG. 20A shows a working angle position, wherein the case is opened and sits in a landscape orientation. This working position is the same as the working position described in FIGS. 3A-3B, only without an elastic strap.

Figure 20B:
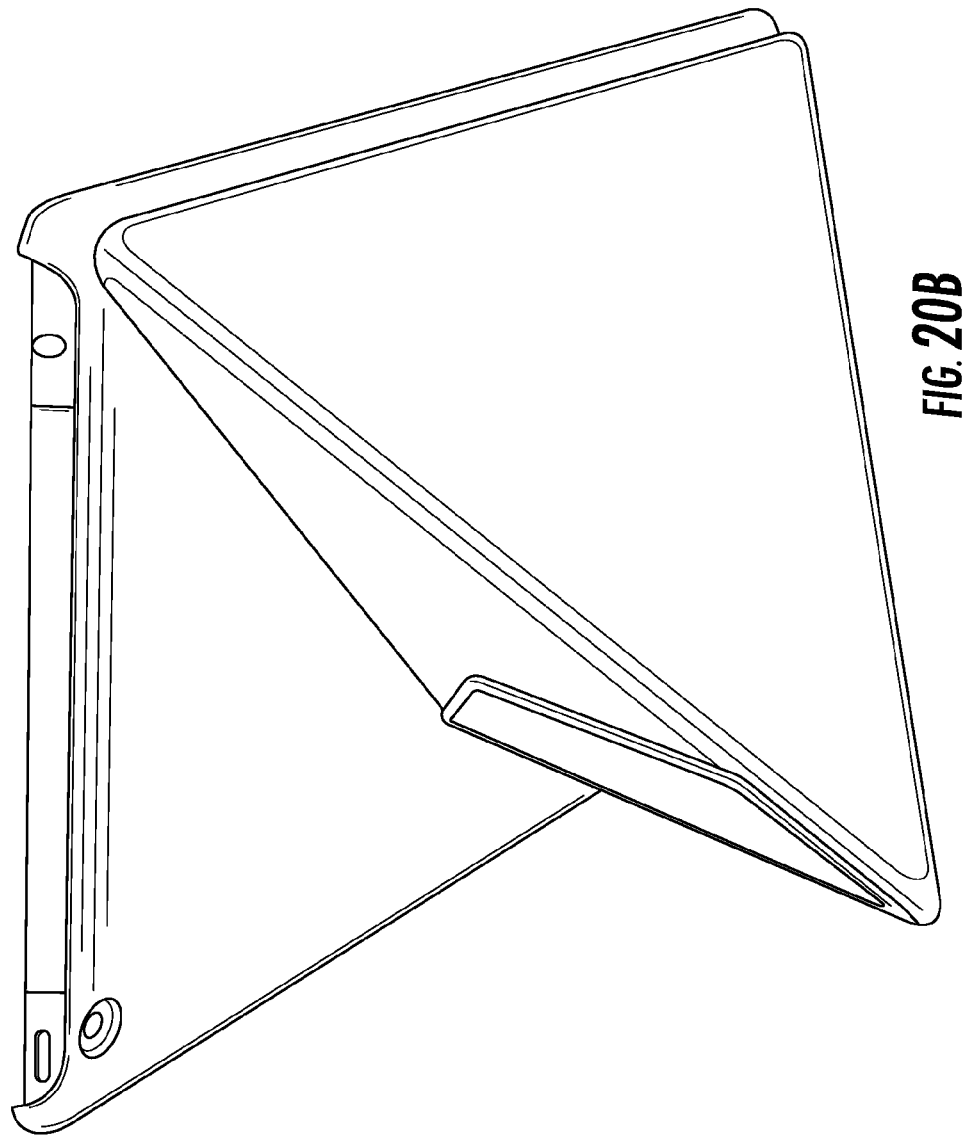
FIG. 20B shows the case folded in another stand position.

FIG. 20B shows a second working angle position, in a portrait orientation. This second viewing angle position is the same as the working position described in FIGS. 4A-4B.

FIGS. 21A-22B show another specific embodiment of the case including a thermoplastic polyurethane (TPU) lock 2115. This implementation omits the flap with magnets and corresponding working angle stop. There can be an elastic band 2110, but this is optional (as described above). The front cover can include one or more panels. In a specific embodiment, a panel can be referred to as an origami flap 2105.

The TPU lock is attached or formed on an exterior surface of the back cover of the case. The TPU lock is used to hold the front cover (while folded) into various stand positions. In an implementation, the TPU lock includes one or more grooves into which edges of the front cover (e.g., folded front cover) can be inserted. These grooves or slits hold the front cover in a desired stand position for the case.

For example, as discussed above for FIGS. 3A-4B, the front cover may be folded along fold lines to form various configurations for a stand. Instead of using a magnetic flap to hold the front flap into a stand position, edges of the front cover are inserted into grooves of the TPU locking mechanism.

The locking mechanism of this specific implementation is made from a thermoplastic polyurethane (TPU), which is composed of a material from a class of polyurethane plastics. There are benefits of using this material, but other materials may also be used while providing similar functional properties. TPU is flexible and capable of some deformation, while still retaining its shape. Furthermore, TPU provides some friction which helps to hold the folded edges of the front cover in place, thereby stabilizing the stand as it sits in different orientations. Although a specific implementation of the TPU lock is made from a thermoplastic polyurethane material, the TPU lock can be made from other types of materials and constructions that allow the forming of grooves as described. The TPU lock may also be referred to as a groove lock or slit lock.

In a specific implementation as shown in FIG. 21B, the TPU lock is a generally rectangular shape. It has a first, second, third, and fourth lock edges, where a first and third lock edges are longer than a second and fourth lock edges. The lock is positioned on the back cover such that a length of the lock aligns with a length of the back cover. In other implementations, the lock can be positioned such that a width of the lock aligns with the length of the back cover.

The lock can have various shapes and sizes. For example, the lock can have a shape that is a square, triangle, circle, oval, quadrilateral, and many others. The corners and edges of the TPU lock may be rounded to prevent against wear and tear.

In the specific implementation show in FIG. 21B, there are two grooves that are positioned at angles with respect an edge of the lock. When the front cover is folded into various configurations, the edges of the front cover can be inserted into grooves of the lock. These positions are shown in greater detail in FIGS. 22A-22B.

Figure 22A:
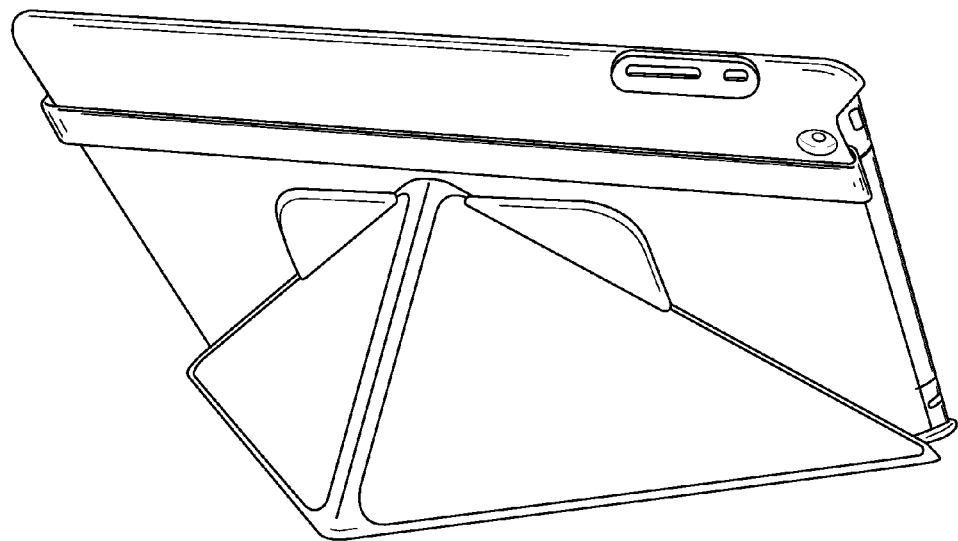
FIGS. 22A-22B show the case folded into various stand positions.

FIG. 22A shows the front cover folded into a stand for a first working angle for the device. The front cover is folded similarly as described above for stand position 2 shown in FIGS. 3A-3B. The device is in the landscape orientation. The front cover has two hinges (not parallel to each other) which allow folding of the front cover so that two adjacent corners of the front cover can meet together. In this stand position, the two adjacent corners meet (or touch) and also touch an exterior side of the back cover (or tablet device when there is no back cover). The TPU lock of the front cover can be used to hold this stand shape and corners together. In a specific implementation, the second working angle is from about 30 to about 38 degrees (e.g., 31, 32, or 33 degrees).

Figure 22B:
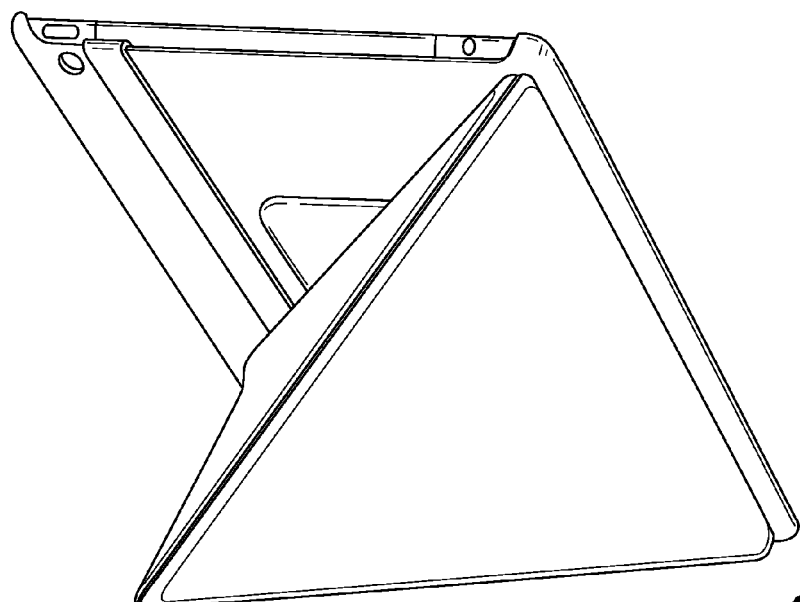

FIG. 22B shows the front cover folded into a stand for a second working angle for the device. The front cover is folded similarly as described for stand position 3 shown in FIGS. 4A-4B. The device is in a portrait orientation, where the device is rotated 90 degrees (or 270 degrees) with respect to the landscape orientation. The display will be oriented so it is taller than it is wide. The front cover is folded similarly as described for the first working angle above, but the stand and tablet have been rotated 90 degrees. In a specific implementation, the second working angle is from about 40 to about 48 degrees (e.g., 41, 42, or 43 degrees). The second working angle is at a greater sloped angle than the first working angle.

It should be appreciated that the back cover of the case is merely an example of how the electronic device may be retained against the cover. Any retaining mechanism may be used to removably hold the electronic device against the cover so long as a front cover can be folded away from the electronic device so that the front cover can be folded into a stand.

In a specific implementation, a case for a portable electronic device includes a bezel defining a rectangular front opening through which a screen of the portable electronic device will be visible, a backing, opposite the rectangular front opening, including a first surface against which a back of the portable electronic device will be placed. In these implementations the backing can be attached to an inside surface of a back cover of the case. The backing and the back cover can be stitched together along the edges of the pieces. Optionally, an adhesive or glue may also be used between backing and the back cover. Alternatively, an adhesive, without stitching, may be used to attach the pieces of the case together. In other implementations, the backing is omitted. The bezel can be attached (e.g., sewn or glued) to the inside surface of the back cover so that the portable electronic device will be placed against the inside surface of the back cover. This configuration can allow for a slimmer case since the layer for the backing is omitted.

In a specific implementation, the case includes a sleeve having the bezel and the backing. The sleeve includes first, second, third, and fourth sides. The first and third sides are longer than the second and fourth sides. The first side includes a side opening through which the portable electronic device can be inserted into the sleeve. The sleeve can also have a latch to removably secure the portable electronic device in the sleeve.

In a specific implementation, the case includes a frame having the bezel and the backing. The bezel includes an elastic material to permit the bezel to be peeled back thereby enlarging the front opening and permitting the electronic device to be inserted through the enlarged front opening.

In another specific implementation, a case for a portable electronic device includes an enclosure or holder portion including first, second, third, fourth, front, and back sides. The first and third sides are longer than the second and fourth sides. The front side includes a bezel defining a rectangular front opening through which a screen of the portable electronic device will be visible.

In other implementations, the backing is omitted. The bezel (of the sleeve, frame, or enclosure) can be attached (e.g., sewn or glued) to the inside surface of the back cover so that the portable electronic device will be placed against the inside surface of the back cover. This configuration can allow for a slimmer case since the layer for the backing is omitted.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A case comprising:
a back cover, comprising a plurality of retaining clips to hold an electronic device against an inside of the back cover;
a front cover, coupled to the back cover, wherein a first fold line is between the front cover and back cover that allows the front cover to swing between covering a front of the electronic device and an outside of the back cover, and the front cover comprises three triangles having two fold lines between the three triangles, a first and second of the triangles comprise the same area and touch at a first vertex at an edge of the front cover that is opposite of the first fold line, and a third triangle has twice the area of the first triangle; and
a flap, coupled to the front cover along the edge of the front cover that is opposite of the first fold line, wherein there is a second fold line between the flap and front cover, and an outer edge of the flap is opposite the second fold line, and wherein the edge of front cover that is opposite of the first fold line is a front edge and the second fold line is coupled to the front edge; and
in a first stand position for the case, the flap is rotated about the second fold line to be at an angle relative to the front cover, and the back cover rests against the outer edge of the flap, that holds the back cover away from the front cover; and
in a second stand position for the case, the first triangle is rotated about a third fold line, between the first and third triangles, and the second triangle is rotated about a fourth fold line, between the second and third triangles, so that at least a portion of the front edge touches the second fold line, and the flap is rotated about the second fold line to fold over the portion of the front edge that touches the second fold line.

2. The case of claim 1 wherein the first triangle comprises a second vertex at an edge of the front cover comprising the first fold line.

3. The case of claim 2 wherein the first triangle comprises a third vertex touching the same edge as the first vertex, but at a corner of the front cover.

4. The case of claim 1 wherein a third fold line is between the first and third triangles, and a fourth fold line is between the second and third triangles.

5. The case of claim 1 wherein the flap comprises a trapezoid shape.

6. The case of claim 1 comprising:
an elastic band, coupled to touch the outside of the back cover.

7. The case of claim 1 wherein in the second stand position, the flap overlaps only the first triangle or the second triangle.

8. The case of claim 1 wherein in the second stand position, the flap overlaps the first triangle, and
in a third position for the case, the flap overlaps the second triangle and not the first triangle.

9. The case of claim 1 wherein the flap comprises:
a first flexible layer, forming an outer surface of the flap;
a rigid layer; and
a second flexible layer, forming an inner surface of the flap, wherein the rigid layer is coupled between the first and second flexible layers.

10. The case of claim 1 wherein the flap comprises a first embedded magnet, and the first triangle comprises a second embedded magnet, and
in the second stand position, the flap overlaps the first triangle, and the first embedded magnet of the flap couples to a second embedded magnet of the first triangle.

11. The case of claim 1 wherein the flap magnetically couples to the first triangle, thus latching the second triangle together to the first triangle.

12. A case comprising:
a back cover, comprising a plurality of retaining clips to hold an electronic device against an inside of the back cover;
a front cover, coupled to the back cover, wherein a first fold line is between the front cover and back cover that allows the front cover to swing between covering a front of the electronic device and an outside of the back cover, and the front cover comprises three triangles having two fold lines between the three triangles, a first and second of the triangles comprise the same area and touch at a first vertex at an edge of the front cover that is opposite of the first fold line, and a third triangle has twice the area of the first triangle;
a front edge of the front cover comprising an edge of the front cover that is opposite of the first fold line;
a flap, coupled to the front cover along the edge of the front cover that is opposite of the first fold line, wherein a second fold line is coupled to the front edge and between the flap and the front cover, and an outer edge of the flap is opposite the second fold line;
a third fold line between the first and third triangles;
a fourth fold line between the second and third triangles;
in a first stand position for the case, the flap is rotated about the second fold line to be at an angle relative to the front cover, and the back cover rests against the outer edge of the flap, that holds the back cover away from the front cover; and
in a second stand position for the case, the first and second triangles are rotated towards each other so that a portion of the second fold line touches a portion of the front edge, wherein the first triangle is rotated about the third fold line and the second triangle is rotated about the fourth fold line, and the flap is rotated about the second fold line, wherein the flap overlaps the first triangle, thus retaining the first and second triangles together in position, and the back cover rests against the first and second triangles.

13. The case of claim 12 wherein an angle between the front and back covers while in the second stand position is an acute angle.

14. The case of claim 12 wherein the flap magnetically couples to the first triangle, thus latching the second triangle together to the first triangle.

* * * * *